(12) United States Patent
Noborio et al.

(10) Patent No.: US 12,464,791 B2
(45) Date of Patent: Nov. 4, 2025

(54) SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Masato Noborio, Nisshin (JP); Tomofumi Niibayashi, Nisshin (JP); Jun Saito, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 445 days.

(21) Appl. No.: 18/172,590

(22) Filed: Feb. 22, 2023

(65) Prior Publication Data

US 2023/0282705 A1 Sep. 7, 2023

(30) Foreign Application Priority Data

Mar. 7, 2022 (JP) ................. 2022-034431
Jan. 19, 2023 (JP) ................. 2023-006761

(51) Int. Cl.
*H10D 62/10* (2025.01)
*H10D 30/66* (2025.01)
*H10D 62/832* (2025.01)

(52) U.S. Cl.
CPC ......... *H10D 62/127* (2025.01); *H10D 30/668* (2025.01); *H10D 62/8325* (2025.01)

(58) Field of Classification Search
CPC .. H10D 30/665; H10D 30/668; H10D 62/106; H10D 62/111; H10D 62/127; H10D 62/157; H10D 62/8325
USPC .......................................................... 257/330
See application file for complete search history.

(56) References Cited

U.S. PATENT DOCUMENTS

| | | |
|---|---|---|
| 2010/0096692 A1 | 4/2010 | Saito et al. |
| 2015/0349056 A1 | 12/2015 | Jin et al. |
| 2017/0125515 A1* | 5/2017 | Shirakawa ............. H10D 30/66 |
| 2018/0166531 A1 | 6/2018 | Bolotnikov et al. |
| 2019/0109228 A1* | 4/2019 | Kobayashi ........... H10D 62/127 |
| 2019/0140048 A1 | 5/2019 | Bolotnikov et al. |
| 2019/0148485 A1 | 5/2019 | Hamada et al. |
| 2019/0181260 A1 | 6/2019 | Maeta |
| 2020/0411683 A1 | 12/2020 | Kaya et al. |

(Continued)

*Primary Examiner* — Fazli Erdem
(74) *Attorney, Agent, or Firm* — Posz Law Group, PLC

(57) ABSTRACT

A semiconductor device includes a substrate, a drift layer of a first conductivity type, a first electrode, a second electrode, a plurality of gate electrodes, and a plurality of repeat regions of a second conductivity type. When center lines respectively passing through centers of the gate electrodes in an arrangement direction of the gate electrodes and extending in a thickness direction of the substrate are defined as cell center lines, a distance between adjacent two of the cell center lines is defined as a cell pitch, center lines respectively passing through centers of the repeat regions in the arrangement direction are defined as repeat center lines, and a distance between adjacent two of the repeat center lines in the arrangement direction is defined as a repeat pitch, the cell pitch is different from the repeat pitch.

11 Claims, 24 Drawing Sheets

(56) References Cited

U.S. PATENT DOCUMENTS

2021/0074808 A1* 3/2021 Nishimura ......... H10D 30/0297
2021/0074847 A1   3/2021 Maeta
2021/0118999 A1   4/2021 Nishio et al.

* cited by examiner

SEMICONDUCTOR DEVICE

CROSS REFERENCE TO RELATED APPLICATIONS

The present application claims the benefit of priority from Japanese Patent Application No. 2022-034431 filed on Mar. 7, 2022 and Japanese Patent Application No. 2023-006761 filed on Jan. 19, 2023. The entire disclosure of the above application is incorporated herein by reference.

TECHNICAL FIELD

The present disclosure relates to a semiconductor device.

BACKGROUND

Conventionally, there have been known semiconductor devices each including gate electrodes and p-type base regions arranged at equal intervals in a surface direction of a substrate, and p-type column regions and n-type column regions alternately and repeatedly arranged.

SUMMARY

The present disclosure provides a semiconductor device including a substrate, a drift layer of a first conductivity type, a first electrode, a second electrode, a plurality of gate electrodes, and a plurality of repeat regions of a second conductivity type. When center lines respectively passing through centers of the gate electrodes in an arrangement direction of the gate electrodes and extending in a thickness direction of the substrate are defined as cell center lines, a distance between adjacent two of the cell center lines is defined as a cell pitch, center lines respectively passing through centers of the repeat regions in the arrangement direction are defined as repeat center lines, and a distance between adjacent two of the repeat center lines in the arrangement direction is defined as a repeat pitch, the cell pitch is different from the repeat pitch.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
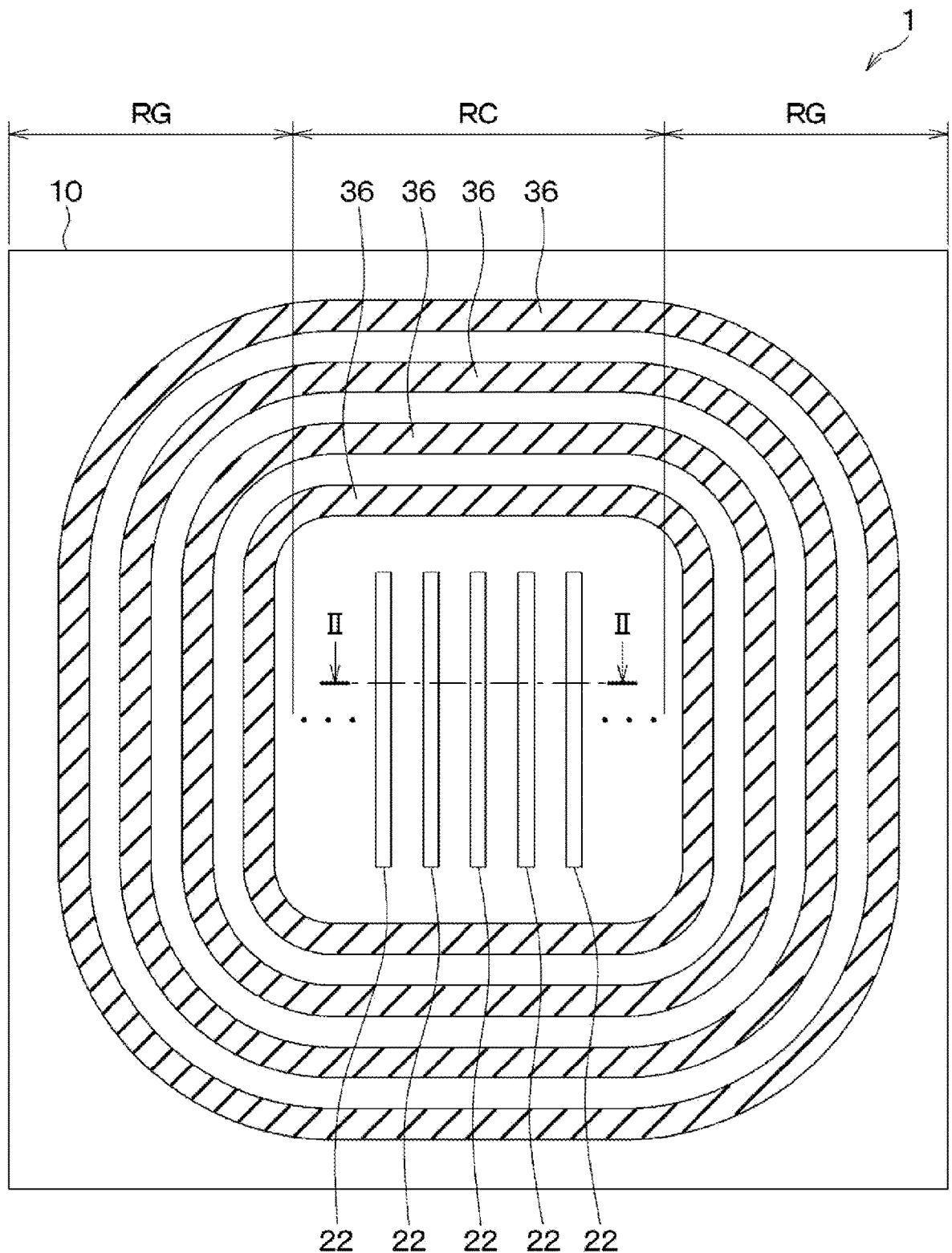
FIG. 1 is an upper surface layout diagram of a semiconductor device according to a first embodiment.

Semiconductor devices according to a relevant technology each includes gate electrodes and p-type base regions arranged at equal intervals in a surface direction of a substrate, and p-type column regions and n-type column regions alternately and repeatedly arranged. Each of the p-type column regions is arranged between adjacent two of the gate electrodes in an arrangement direction of the gate electrodes. Furthermore, the arrangement interval of the gate electrodes is set to be equal to an arrangement interval of the p-type column regions.

When the semiconductor devices are manufactured, relative positions of the p-type column regions with respect to the gate electrodes may vary due to misalignment of masks. Since the arrangement interval of the gate electrodes and the arrangement interval of the p-type column regions are equal to each other in the semiconductor devices described above, intervals between the gate electrodes and the p-type column regions may vary, and for example, the respective p-type column regions may be arranged right opposite the gate electrodes in a thickness direction of the substrate. Therefore, when the semiconductor devices are turned on and channel regions are formed in the p-type base regions, movement of electrons that flow through the n-type column regions may be interfered by the p-type column regions, and on-resistance of the semiconductor devices may increase. Thus, in the semiconductor devices described above, variations in on-resistance among the semiconductor devices may be large due to variations in the relative positions of the p-type column regions with respect to the gate electrodes generated in manufacturing processes.

According to an aspect of the present disclosure, a semiconductor device includes a substrate, a drift layer, a first electrode, a second electrode, a plurality of gate electrodes, and a plurality of repeat regions. The substrate has a front surface and a rear surface opposite to each other, and has a cell region in which a semiconductor element is disposed. The drift layer has a first conductivity type, is disposed on the front surface of the substrate, and has an impurity concentration lower than an impurity concentration of the substrate. The first electrode is disposed close to a surface of the drift layer. The second electrode is disposed close to the rear surface of the substrate. The plurality of gate electrodes is arranged apart from each other in one direction as an arrangement direction of the plurality of gate electrodes. The plurality of gate electrodes is configured to turn on the semiconductor element and cause an electric current to flow between the first electrode and the second electrode in response to an applied voltage. The plurality of repeat regions has a second conductivity type, is disposed in the drift layer, and is arranged apart from each other in the arrangement direction of the plurality of gate electrodes. A plurality of center lines each of which passing through a center of each of the plurality of gate electrodes in the arrangement direction of the plurality of gate electrodes and extending in a thickness direction of the substrate is defined as a plurality of cell center lines. A distance between adjacent two of the plurality of cell center lines in the arrangement direction of the plurality of gate electrodes is defined as a cell pitch. A plurality of center lines each of which passing through a center of each of the plurality of repeat regions in the arrangement direction of the plurality of gate electrodes and extending in the thickness direction of the substrate is defined as a plurality of repeat center lines. A distance between adjacent two of the plurality of repeat center lines in the arrangement direction of the plurality of gate electrodes is defined as a repeat pitch. The cell pitch is different from the repeat pitch.

Accordingly to the configuration described above, even when relative positions of the plurality of repeat regions with respect to the plurality of gate electrodes in the arrangement direction of the plurality of gate electrodes are shifted, a range of variation in on-resistance of the semiconductor device is smaller than that in a case where the cell pitch is equal to the repeat pitch. Therefore, the variation in on-resistance among the semiconductor devices can be reduced.

Hereinafter, embodiments will be described with reference to the drawings. In the following embodiments, the same or equivalent portions are denoted by the same reference numerals, and the description thereof will be omitted.

First Embodiment

A semiconductor device 1 according to a first embodiment can be used, for example, to drive an electronic device for a vehicle. The present embodiment describes a silicon carbide (SiC) semiconductor device formed with a metal-oxide-semiconductor field effect transistor (MOSFET) having a trench gate structure as an example of the semiconductor device 1.

Figure 2:
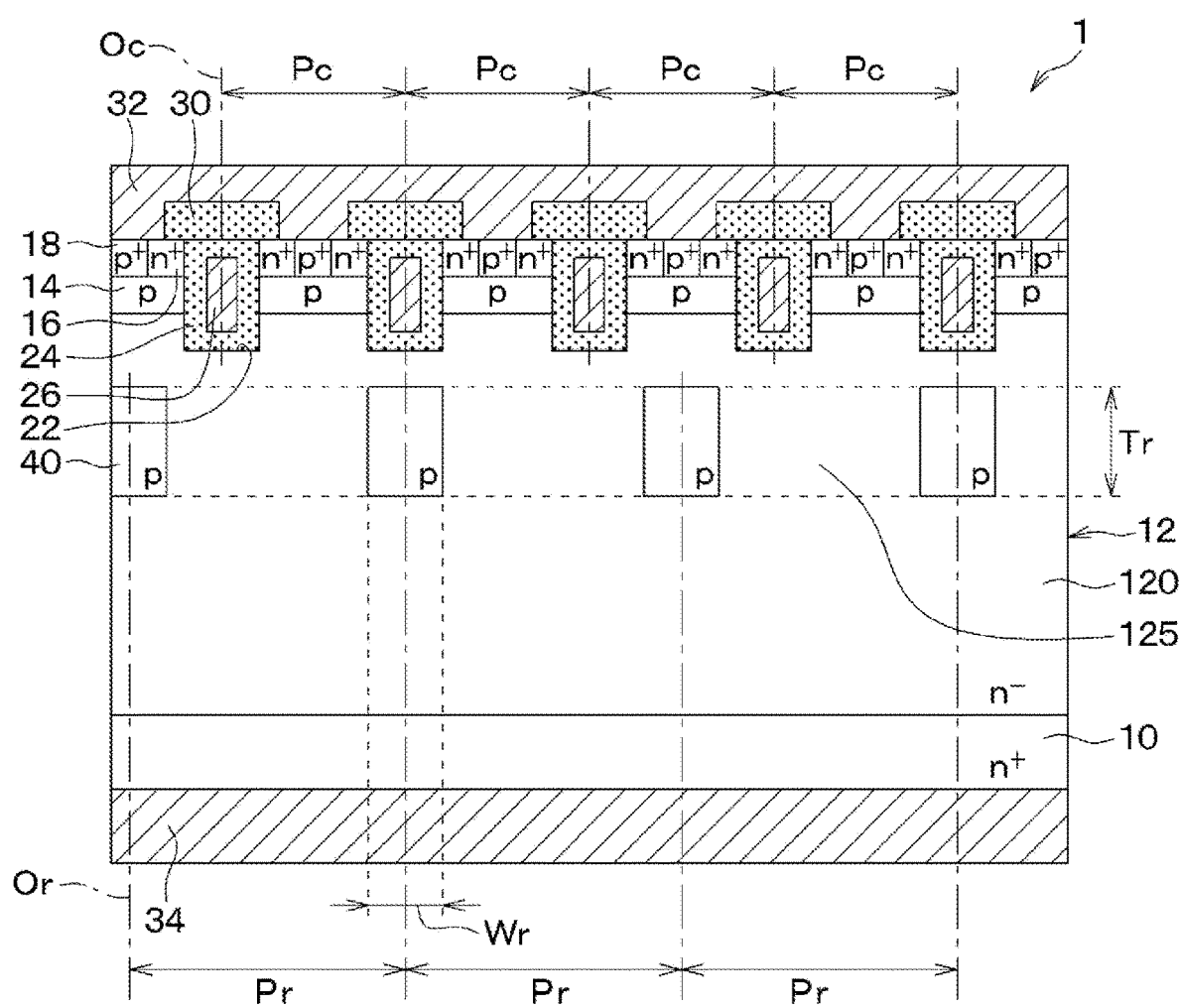
FIG. 2 is a cross-sectional view of the semiconductor device taken along line II-II in FIG. 1.

As shown in FIG. 1 and FIG. 2, the semiconductor device 1 includes an n$^+$-type substrate 10, a drift layer 12, p-type base regions 14, n$^+$-type source regions 16 and p-type contact regions 18. The semiconductor device 1 also includes gate trenches 22, gate insulating films 24, gate electrodes 26, an interlayer insulating film 30, a source electrode 32, a drain electrode 34, p-type guard rings 36 and repeat regions 40.

The n$^+$-type substrate 10 is formed of SiC in a quadrangle shape. The n$^+$-type substrate 10 has an n-type impurity concentration of, for example, $1.0 \times 10^{19}/cm^3$. The n$^+$-type substrate 10 has a front surface that is, for example, a (0001) Si plane. The n$^+$-type substrate 10 has an off angle that is, for example, a <11-20> direction. Note that n-type impurities are, for example, nitrogen, phosphorus, or the like.

A region of the semiconductor device 1 in which the MOSFET is disposed is referred to as a cell region RC. Furthermore, a region surrounding the cell region RC is referred to as an outer peripheral region RG.

The drift layer 12 has an n$^-$-type layer 120. The n$^-$-type layer 120 is formed of SiC on the front surface of the n$^+$-type substrate 10 in the cell region RC and the outer peripheral region RG. The n$^-$-type layer 120 has an n-type impurity concentration that is lower than the n-type impurity concentration of the n$^+$-type substrate 10. The n-type impurity concentration of the n$^-$-type layer 120 is, for example, $5.0 \times 10^{15}$ to $2.0 \times 10^{16}/cm^3$. The n$^-$-type layer 120 forms n-type columns 125 that are alternately arranged with p-type columns of the repeat regions 40, as will be described below.

The p-type base regions 14 are formed of SiC in a surface layer portion of the n$^-$-type layer 120 in the cell region RC. The p-type base regions 14 have a p-type impurity concentration of, for example, $2.0 \times 10^{17}/cm^3$. The p-type base regions 14 have a thickness of, for example, 300 nm. Note that the p-type impurity is, for example, aluminum, boron, or the like.

The n$^+$-type source regions 16 are formed in surface layer portions of the p-type base regions 14. The n$^+$-type source regions 16 have an n-type impurity concentration that is higher than the n-type impurity concentration of the n$^+$-type substrate 10. The n-type impurity concentration of the n$^+$-type source regions 16 is, for example, $2.5 \times 10^{18}$ to $1.0 \times 10^{19}/cm^3$. The n$^+$-type source regions 16 have a thickness of, for example, 500 nm.

The p-type contact regions 18 are formed at the surface layer portions of the p-type base regions 14. Each of the p-type contact regions 18 is sandwiched between two of the n$^+$-type source regions 16. The p-type contact regions 18 have a p-type impurity concentration that is higher than the p-type impurity concentration of the p-type base regions 14.

The gate trenches 22 extend in one direction, for example, a vertical direction of a paper surface of FIG. 1 as a longitudinal direction. The gate trenches 22 penetrate the p-type base regions 14 and the n$^+$-type source regions 16 and reach the n$^-$-type layer 120. Each of the gate trenches 22 has a width of, for example, 800 nm. Each of the gate trenches 22 has a depth of, for example, 1000 nm. Side surfaces of the gate trenches 22 are in contact with the p-type base regions 14 and the n$^+$-type source regions 16. Portions of the p-type base regions 14 being in contact with the side surfaces of the gate trenches 22 become channel regions that connect the n$^+$-type source regions 16 and the n$^-$-type layer 120 during operation of the MOSFET.

The gate insulating films 24 have electric insulation. The gate insulating films 24 are formed on inner wall surfaces of the gate trenches 22 including the channel regions. The gate insulating films 24 are formed by, for example, thermally oxidizing the inner wall surfaces of the gate trenches 22 or using a chemical vapor deposition (CVD) method. The gate insulating films 24 have a thickness of, for example, 100 nm.

The gate electrodes 26 are arranged apart from each other in a direction as an arrangement direction of the gate electrodes 26. The gate electrodes 26 are formed of doped polysilicon on surfaces of the gate insulating films 24.

Accordingly, the trench gate structure having the one direction as a longitudinal direction is formed.

The interlayer insulating film 30 has electric insulation. The interlayer insulating film 30 is formed on portions of the n⁻-type layer 120, portions of the n⁺-type source regions 16, and surfaces of the gate insulating films 24.

The source electrode 32 corresponds to a first electrode. The source electrode 32 is formed of multiple metals, for example, nickel (Ni) and aluminum (Al). The source electrode 32 is electrically connected to the n⁺-type source regions 16 and the p-type contact regions 18 through contact holes provided in the interlayer insulating film 30. Portions of the source electrode 32 being in contact with the n⁺-type source regions 16 are formed of a metal capable of forming ohmic contact with n-type SiC. Portions of the source electrode 32 being in contact with the p-type contact regions 18 are formed of a metal capable of forming ohmic contact with p-type SiC.

The drain electrode 34 corresponds to a second electrode. The drain electrode 34 is formed on a rear surface of the n⁺-type substrate 10 in the cell region RC and the outer peripheral region RG.

The p-type guard rings 36 are formed at a surface layer portion of the n⁺-type substrate 10 in the outer peripheral region RG. When viewed from above, each of the p-type guard rings 36 has a quadrangular shape in which four corners are rounded. Furthermore, a cross section of each of the p-type guard rings 36 in a thickness direction of the n⁺-type substrate 10 along a radial direction centering on a center of the cell region RC has a quadrangular shape. The p-type guard rings 36 have a p-type impurity concentration that is, for example, the same as the p-type impurity concentration of the p-type base regions 14. For example, the p-type impurity concentration of the p-type guard rings 36 is $2.0 \times 10^{17}/cm^3$. The p-type guard rings 36 have a thickness of, for example, 800 nm.

The repeat regions 40 are p-type columns alternately repeated with the n-type columns 125 composed of the n⁻-type layer 120 in the arrangement direction of the gate electrodes 26 so as to form a super junction structure. Specifically, the repeat regions 40 are disposed between the gate trenches 22 and the rear surface of the n⁺-type substrate 10 in the thickness direction of the n⁺-type substrate 10, and are arranged apart from each other in the arrangement direction of the gate electrodes 26. The repeat regions 40 are formed of SiC in the n⁻-type layer 120 in the cell region RC. A distance between bottom portions of the gate trenches 22 and upper portions of the repeat regions 40 in the thickness direction of the n⁺-type substrate 10 is, for example, 0.2 to 3.0 μm. The repeat regions 40 have a p-type impurity concentration of, for example, $2.0 \times 10^{16}$ to $5.0 \times 10^{17}/cm^3$. In a cross section different from the cross section shown in FIG. 2, the repeat regions 40 are connected to the source electrode 32 via a coupling layer (not shown). As a result, the super junction structure is formed in which the p-type columns composed of the repeat regions 40 and the n-type columns 125 composed of the n⁻-type layer 120 are alternately repeated.

Here, center lines each of which passing through a centers of each of the gate electrodes 26 in the arrangement direction of the gate electrodes 26 and extending in the thickness direction of the n⁺-type substrate 10 are defined as cell center lines Oc. A distance between adjacent two of the cell center lines Oc in the arrangement direction of the gate electrodes 26 is defined as a cell pitch Pc. Center lines each of which passing through a center of each of the repeat regions 40 in the arrangement direction of the gate electrodes 26 and extending in the thickness direction of the n⁺-type substrate 10 are defined as repeat center lines Or. A distance between adjacent two of the repeat center lines Or in the arrangement direction of the gate electrodes 26 is defined as a repeat pitch Pr. A width of each the repeat regions 40 is defined as region width Wr. A thickness of each of the repeat regions 40 is defined as region thickness Tr. In addition, a natural number of 2 or more is defined as i. Furthermore, a natural number of 2 or more different from i is defined as j. The arrangement direction of the gate electrodes 26 is the horizontal direction in FIG. 2. The region width Wr is the length of each of the repeat regions 40 in the arrangement direction of the repeat regions 40, and is the length in the horizontal direction in FIG. 2. Furthermore, the region thickness Tr is the length of each of the repeat regions 40 in the thickness direction of the n⁺-type substrate 10, and is the length in the vertical direction in FIG. 2.

The cell pitch Pc is, for example, 1.0 to 2.0 μm. The repeat pitch Pr is, for example, 1.2 to 3.0 μm. The cell pitch Pc is different from the repeat pitch Pr. Therefore, the relationship of Pc≠Pr is established. The region width Wr is approximately half the repeat pitch Pr. The region thickness Tr is larger than the region width Wr, for example, 1.5 times or more the region width Wr. Furthermore, the relationship of i×Pc=j×Pr is established. Therefore, the cell center lines Oc coincide with the repeat center lines Or at intervals of the value of i×Pc=j×Pr, and the value of i×Pc=j×Pr is preferably 3 μm or more.

The semiconductor device 1 of the first embodiment is configured as described above. Next, a manufacturing method of the semiconductor device 1 will be described.

A lower layer part of the n⁻-type layer 120 is formed on the front surface of the n⁺-type substrate 10 by epitaxial growth or the like. Next, the repeat regions 40 are formed in a surface layer portion of the lower layer part of the n⁻-type layer 120 by ion implantation of p-type impurities. As a result, the super junction structure is formed in which the p-type columns composed of the repeat regions 40 and the n-type columns 125 composed of the n⁻-type layer 120 are alternately repeated.

Subsequently, an upper layer part of the n⁻-type layer 120 is formed on the lower layer part of the n⁻-type layer 120 and the surfaces of the repeat regions 40 by epitaxial growth or the like. In addition, the p-type base regions 14 are formed in the surface layer portion of the upper layer part of the n⁻-type layer 120 by ion implantation of p-type impurities. Furthermore, the n⁺-type source regions 16 are formed by ion implantation of n-type impurities, and then the p-type contact regions 18 are formed by ion implantation of p-type impurities. In addition, the p-type guard rings 36 are formed in the surface layer portion of the upper layer part of the n⁻-type layer 120 by ion implantation of p-type impurities. In the present embodiment, the lower layer part of the n⁻-type layer 120 has the same n-type impurity concentration as the upper layer part of the n⁻-type layer 120. However, the n-type impurity concentration of the lower layer part of the n⁻-type layer 120 may be different from the n-type impurity concentration of the upper layer part of the n⁻-type layer 120.

Furthermore, the gate trenches 22 are formed by anisotropic etching such as reactive ion etching (RIE) using a mask. The gate insulating films 24 are formed by thermal oxidation, chemical vapor deposition (CVD), or the like, and the inner wall surfaces of the gate trenches 22 and the n⁺-type source regions 16 are covered with the gate insulating films 24. Then, a polysilicon layer doped with p-type impurities or n-type impurities is formed by CVD or the like. The polysilicon layer is etched back so as to leave at least portions of the polysilicon layer in the gate trenches 22. Accordingly, the gate electrodes 26 arranged with the cell pitch Pc different from the repeat pitch Pr are formed. Furthermore, the interlayer insulating film 30 is formed by CVD or the like, and the gate insulating films 24 and the gate electrodes 26 are covered with the interlayer insulating film 30. After a mask (not shown) is formed on the surface of the interlayer insulating film 30, portions of the mask located between the gate electrodes 26, that is, portions corresponding to the p-type contact regions 18 and their vicinity are opened. Thereafter, the interlayer insulating film 30 is patterned using the mask to form the contact holes exposing the $n^+$-type source regions 16 and the p-type contact regions 18. Then, the source electrode 32 is formed by patterning electrode material. Finally, the drain electrode 34 is formed on the rear surface of the $n^+$-type substrate 10.

The semiconductor device 1 is manufactured as described above. When the MOSFET in the semiconductor device 1 is turned on, a voltage applied to the gate electrodes 26 is controlled. At this time, channel regions are formed in the surface portions of the p-type base regions 14 located on the side surfaces of the gate trenches 22. Accordingly, electric currents flow between the source electrode 32 and the drain electrode 34 through the $n^+$-type source regions 16, the channel regions, the drift layer 12 including the $n^-$-type layer 120 and the n-type columns 125, and the $n^+$-type substrate 10.

Equipotential lines when the semiconductor device 1 is turned off extend from the cell region RC toward the outer peripheral region RG, and extend from the rear surface toward the front surface of the $n^+$-type substrate 10 in the outer peripheral region RG. Then, in the outer peripheral region RG, the equipotential lines are gradually terminated by the p-type guard rings 36 from the cell region RC toward the outer peripheral region RG. Accordingly, a breakdown voltage of the semiconductor device 1 is improved.

Furthermore, when the MOSFET is turned off, depletion layers are formed in the vicinities of the repeat regions 40 due to the super junction structure in which the p-type columns composed of the repeat regions 40 and the n-type columns 125 composed of the $n^-$-type layer 120 are alternately repeated. Accordingly, the breakdown voltage of the semiconductor device 1 is improved. The vicinities of the repeat regions 40 in which the depletion layers are formed include portions between the bottom portions of the gate trenches 22 and the repeat regions 40, portions between the repeat regions 40, and portions between the repeat regions 40 and the $n^+$-type substrate 10.

The semiconductor device 1 can reduce variations in on-resistance among the semiconductor devices 1 as described below.

In order to explain the reduction of variation, a comparative semiconductor device 900 according to a comparative example will be described with reference to FIG. 3.

Figure 3:
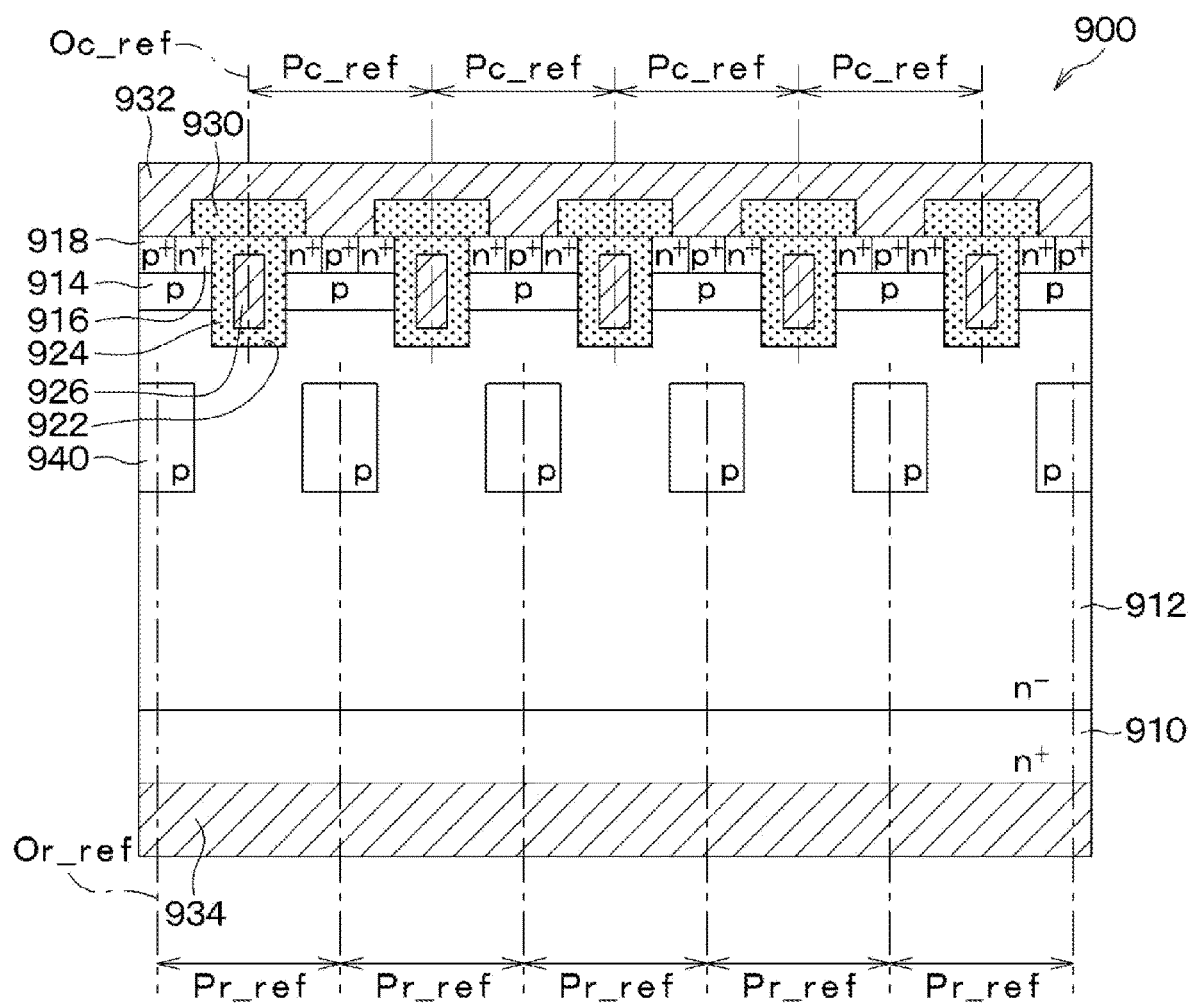
FIG. 3 is a cross-sectional view of a semiconductor device according to a comparative example.

As shown in FIG. 3, the comparative semiconductor device 900 includes a comparative $n^+$-type substrate 910, a comparative $n^-$-type layer 912, comparative p-type base regions 914, comparative $n^+$-type source regions 916, and comparative p-type contact regions 918. The comparative semiconductor device 900 further includes comparative gate trenches 922, comparative gate insulating films 924, comparative gate electrodes 926, a comparative interlayer insulating film 930, a comparative source electrode 932, a comparative drain electrode 934, and comparative p-type column regions 940. The comparative $n^+$-type substrate 910 corresponds to the $n^+$-type substrate 10. The comparative $n^-$-type layer 912 corresponds to the $n^-$-type layer 120. The comparative p-type base regions 914 correspond to the p-type base regions 14. The comparative $n^+$-type source regions 916 correspond to the $n^+$-type source regions 16. The comparative p-type contact regions 918 correspond to the p-type contact regions 18. The comparative gate trenches 922 correspond to the gate trenches 22. The comparative gate insulating films 924 correspond to the gate insulating films 24. The comparative gate electrodes 926 correspond to the gate electrodes 26. The comparative interlayer insulating film 930 corresponds to the interlayer insulating film 30. The comparative source electrode 932 corresponds to the source electrode 32. The comparative drain electrode 934 corresponds to the drain electrode 34. The comparative p-type column regions 940 correspond to the repeat regions 40. Therefore, detailed description of these components of the comparative semiconductor device 900 will be omitted.

Here, center lines each of which passing through a center of each of the comparative gate electrodes 926 in the arrangement direction of the comparative gate electrodes 926 and extending in the thickness direction of the comparative $n^+$-type substrate 910 are defined as comparative cell center lines Oc_ref. A distance between adjacent two of the comparative cell center lines Oc_ref in the arrangement direction of the comparative gate electrodes 926 is defined as a comparative cell pitch Pc_ref. Center lines each of which passing through a center of each of the comparative p-type column regions 940 in the arrangement direction of the comparative gate electrodes 926 and extending in the thickness direction of the comparative $n^+$-type substrate 910 are defined as comparative column center lines Or_ref. A distance between adjacent two of the comparative column center lines Or_ref in the arrangement direction of the comparative gate electrodes 926 is defined as a comparative column pitch Pr_ref. It should be noted that a length in the arrangement direction of the comparative gate electrodes 926 is a length in the horizontal direction in FIG. 3.

In the comparative semiconductor device 900, the comparative cell pitch Pc_ref is equal to the comparative column pitch Pr_ref. Thus, a relationship of Pc_ref=Pr_ref is established. In addition, the comparative cell pitch Pc_ref is equal to the cell pitch Pc. Therefore, in the comparative semiconductor device 900, a relationship of Pc_ref=Pr_ref=Pc is established. Furthermore, each of the comparative column center lines Or_ref passes through a center between adjacent two of the comparative cell center lines Oc_ref.

Figure 4:
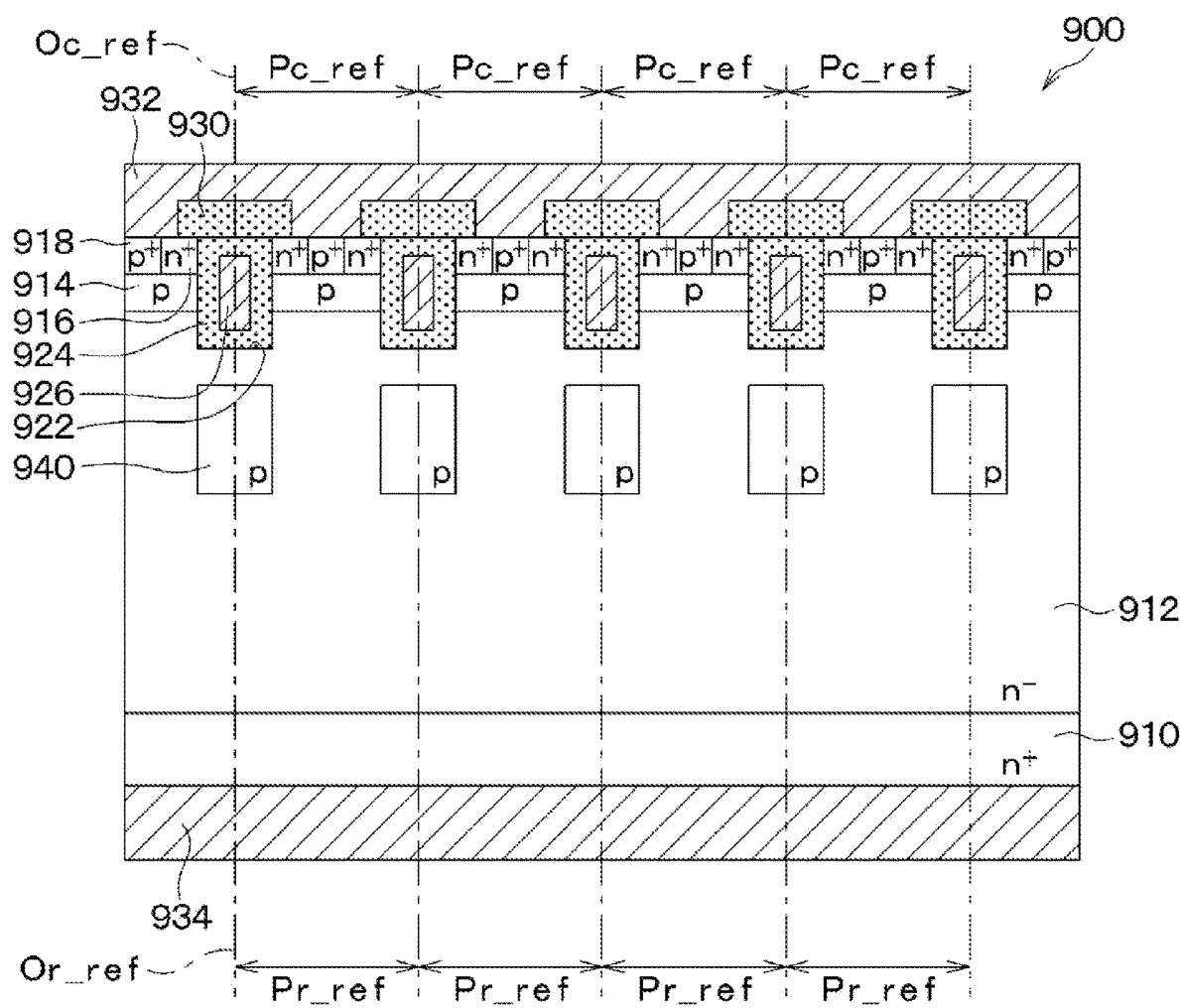
FIG. 4 is a cross-sectional view of a semiconductor device according to a comparative example in a case where relative positions of comparative p-type column regions with respect to comparative gate electrodes are shifted.
Figure 5:
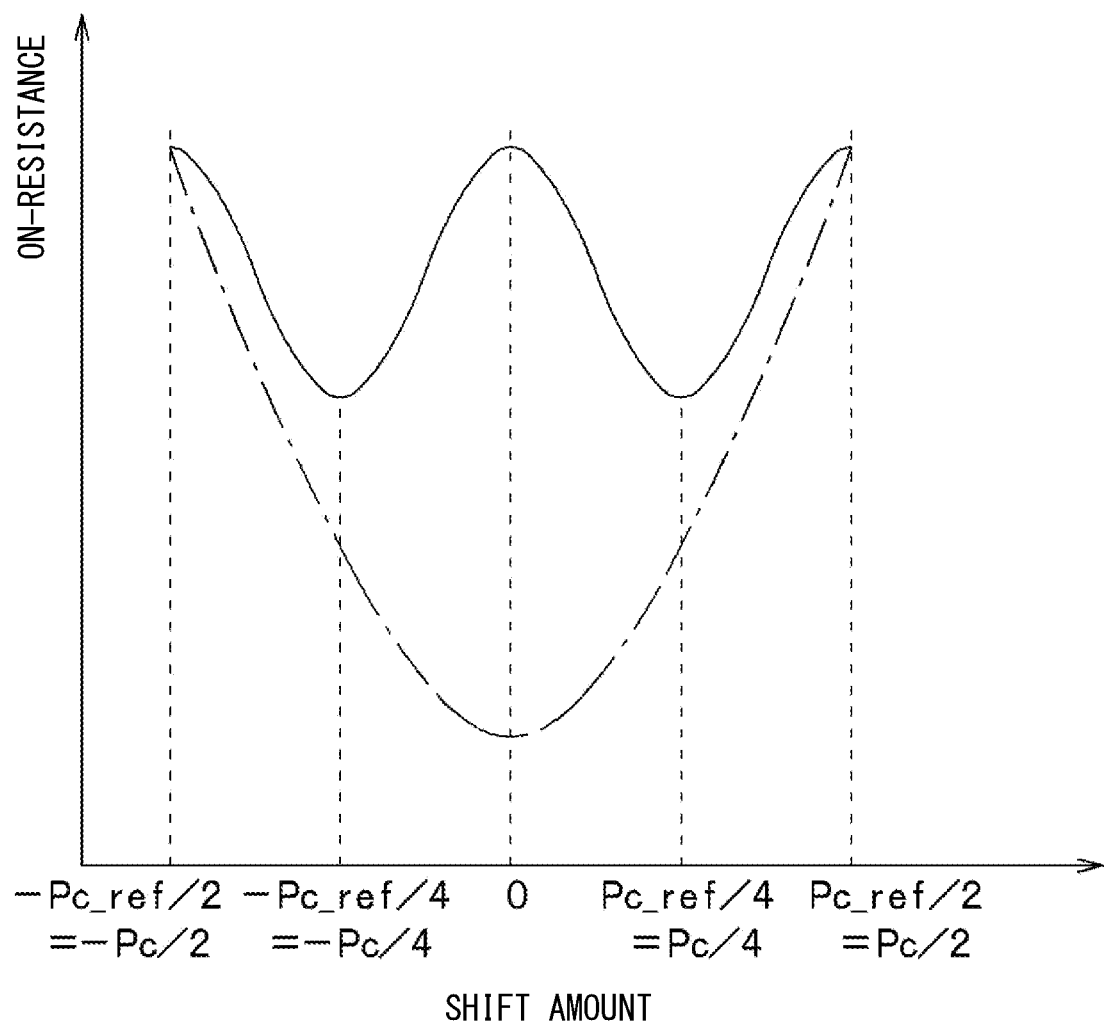
FIG. 5 is a diagram showing a relationship between a shift amount and an on-resistance.

Assuming that, when manufacturing the comparative semiconductor device 900, relative positions of the comparative p-type column regions 940 with respect to the comparative gate electrodes 926 are shifted by ½ of the comparative cell pitch Pc_ref and the comparative column pitch Pr_ref, as shown in FIG. 4. At this time, the comparative column center lines Or_ref coincide with the comparative cell center lines Oc_ref. Since the comparative cell pitch Pc_ref is equal to the comparative column pitch Pr_ref, distances between the comparative gate electrodes 926 and the comparative p-type column regions 940 change. As a result, the comparative p-type column regions 940 are arranged right opposite the comparative gate electrodes 926 in the thickness direction of the comparative $n^+$-type substrate 910. Therefore, when the comparative semiconductor device 900 is turned on and channel regions are formed in the comparative p-type base regions 914, the movement of electrons flowing through the comparative $n^-$-type layer 912 is interfered by the comparative p-type column regions 940. At this time, as shown in FIG. 5, the on-resistance increases as compared with a case where each of the comparative column center lines Or_ref passes through the center between adjacent two of the comparative cell center lines Oc_ref. Thus, the variation in the relative positions of the comparative p-type column regions 940 with respect to the comparative gate electrodes 926 due to manufacturing causes a large variation in on-resistance among the comparative semiconductor devices 900. In FIG. 5, the shift amount indicates a shift amount of the relative positions of the comparative p-type column regions 940 with respect to the comparative gate electrodes 926 in the arrangement direction of the comparative gate electrodes 926. The shift amount when each of the comparative column center lines Or_ref pass through the center between adjacent two of the comparative cell center lines Oc_ref is indicated as 0. In addition, the shift amount when the comparative column center lines Or_ref coincide with the comparative cell center lines Oc_ref is indicated as Pc_ref/2. Furthermore, the relationship between the shift amount and the on-resistance in the comparative semiconductor device 900 is indicated by a dashed line, and the relationship between the shift amount and the on-resistance in the semiconductor device 1 is indicated by a solid line. The right direction in FIGS. 3 and 4 is indicated as a positive direction of the shift amount. The left direction in FIGS. 3 and 4 is indicated as a negative direction of the shift amount.

In contrast, in the semiconductor device 1 of the present embodiment, the cell pitch Pc is different from the repeat pitch Pr. The meaning of the configuration in which the cell pitch Pc is different from the repeat pitch Pr will be explained.

Figure 6:
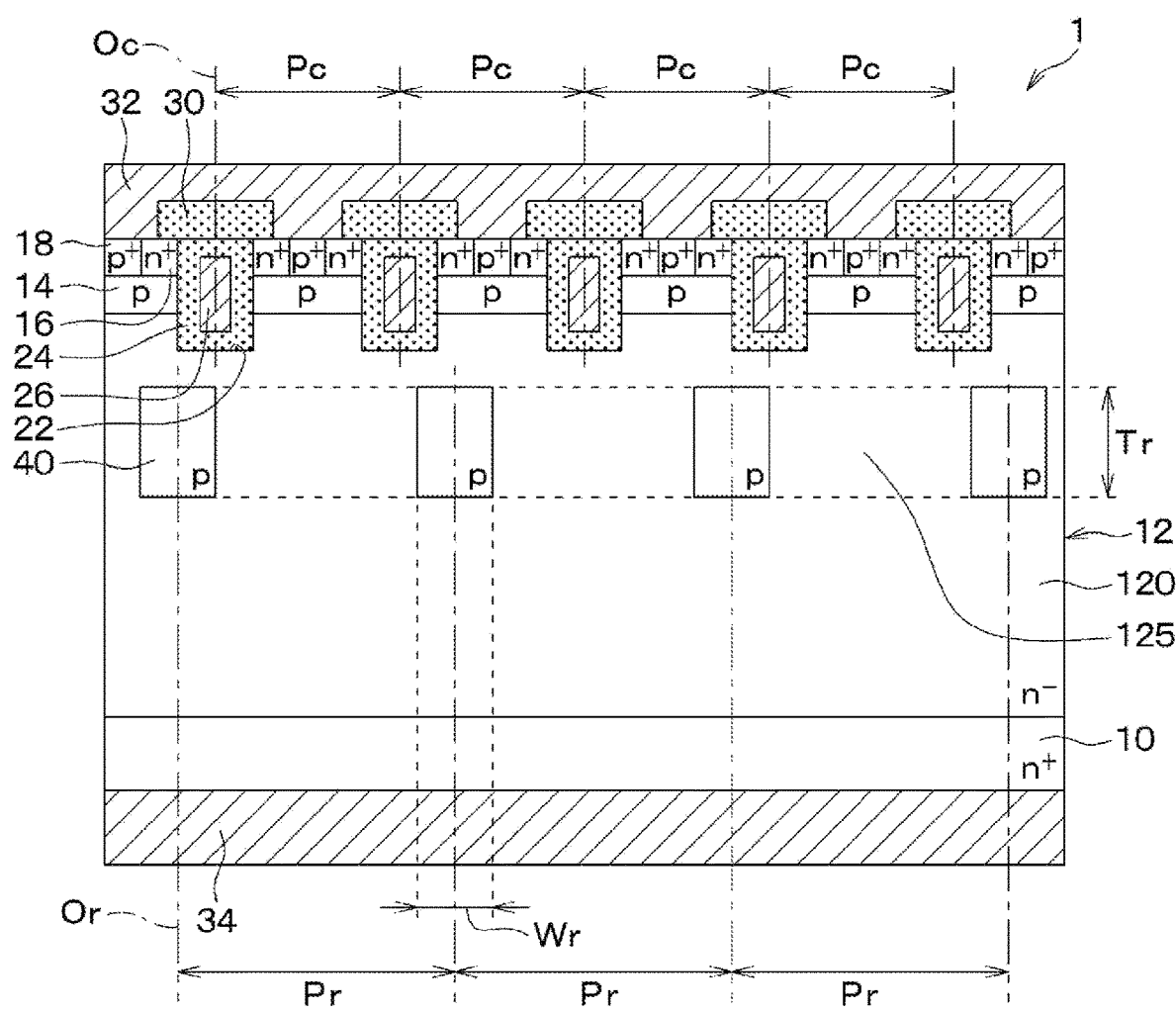
FIG. 6 is a cross-sectional view of a semiconductor device when a shift amount is ¼ of a cell pitch.

Assuming that, as shown in FIG. 6, the relative positions of the repeat regions 40 with respect to the gate electrodes 26 is shifted by ¼ of the cell pitch Pc in the arrangement direction of the gate electrodes 26 from the arrangement shown in FIG. 2. In the arrangement shown in FIG. 2, some of the repeat regions 40 are arranged right opposite some of the gate electrodes 26 in the thickness direction of the n$^+$-type substrate 10. However, in the arrangement shown in FIG. 6, none of the repeat regions 40 is arranged right opposite the gate electrodes 26 in the thickness direction of the n$^+$-type substrate 10. Therefore, when the semiconductor device 1 is turned on and the channel regions are formed in the p-type base regions 14, the movement of electrons flowing through the n$^-$-type layer 120 is less likely to be interfered by the repeat regions 40, and the electrons are more likely to flow as compared with the arrangement shown in FIG. 2. Therefore, at this time, as shown by the solid line in FIG. 5, the on-resistance is reduced as compared with the arrangement shown in FIG. 2. In FIG. 5, the shift amount in the arrangement shown in FIG. 2 is indicated as 0. Since the comparative cell pitch Pc_ref is equal to the cell pitch Pc, the shift amount when the shift amount is ¼ of the cell pitch Pc is indicated as Pc_ref/4=Pc/4. The right direction in FIG. is indicated as the positive direction of the shift amount. The left direction in FIG. 2 is indicated as the negative direction of the shift amount.

Figure 7:
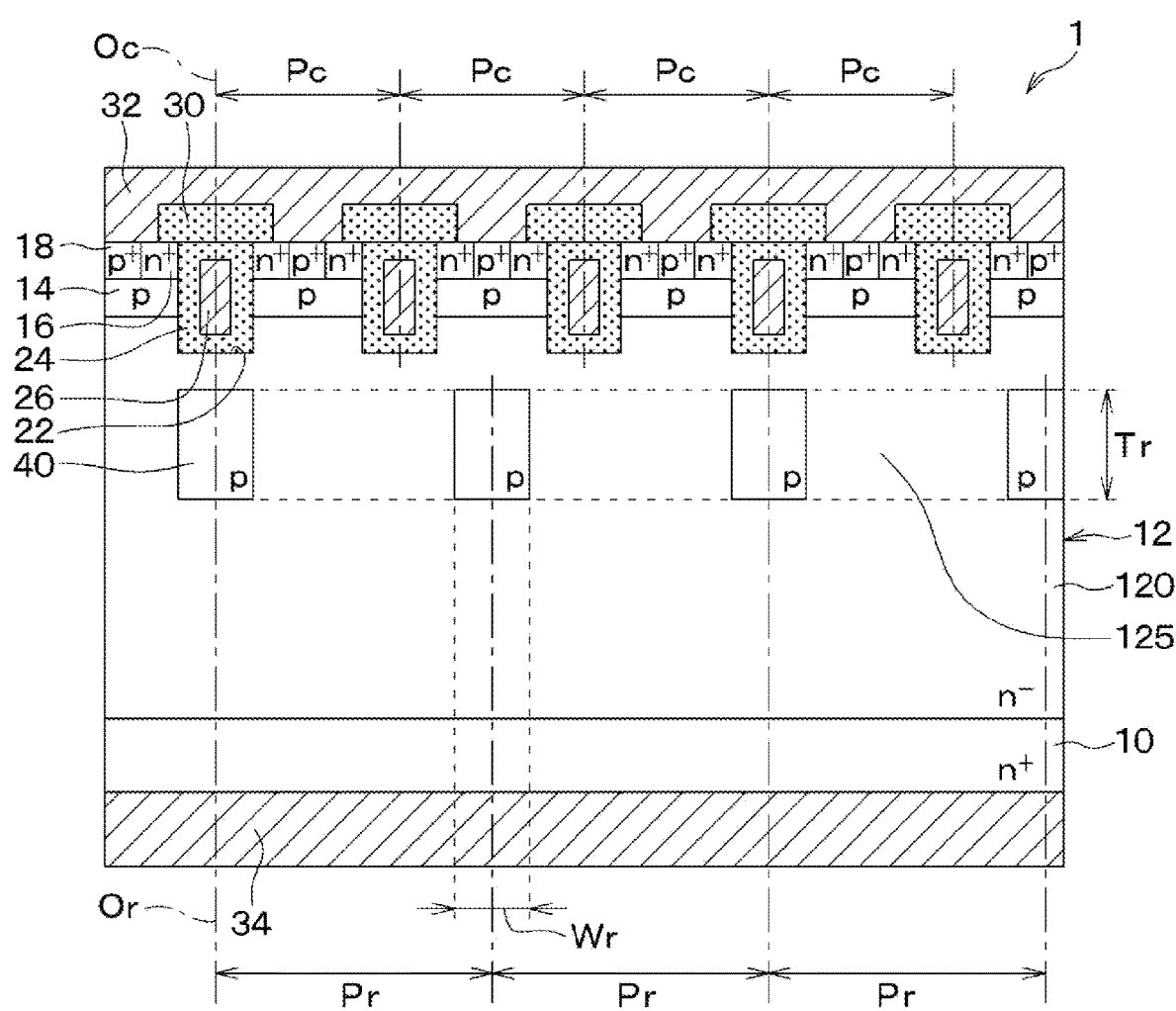
FIG. 7 is a cross-sectional view of a semiconductor device when a shift amount is ½ of a cell pitch.

Furthermore, assuming that, as shown in FIG. 7, the relative positions of the repeat regions 40 with respect to the gate electrodes 26 is shifted by ½ of the cell pitch Pc in the arrangement direction of the gate electrodes 26 from the arrangement shown in FIG. 2. At this time, some of the repeat regions 40 are arranged right opposite some of the gate electrodes 26 in the thickness direction of the n$^+$-type substrate 10. Therefore, when the semiconductor device 1 is turned on and the channel regions are formed in the p-type base regions 14, the movement of electrons flowing through the n$^-$-type layer 120 is interfered by the repeat regions 40, and the electrons are less likely to flow as compared with the arrangement shown in FIG. 6. Thus, at this time, as shown in FIG. 5, the on-resistance increases as compared with the arrangement shown in FIG. 6. Furthermore, a distance relationship between the gate electrodes 26 and the repeat regions 40 in the arrangement shown in FIG. 7 is same as that in the arrangement shown in FIG. 2. As a result, the on-resistance in the arrangement shown in FIG. 7 is the same as the on-resistance in the arrangement shown in FIG. 2. In FIG. 5, the shift amount when the shift amount is ½ of the cell pitch Pc is indicated as Pc_ref/2=Pc/2.

Thus, in the semiconductor device 1 according to the present embodiment, when the shift amount is within the range of ½ of the cell pitch Pc, the on-resistance decreases and increases with increase in the shift amount. On the other hand, in the comparative semiconductor device 900, when the shift amount is within the range of ½ of the cell pitch Pc, that is, ½ of the comparative cell pitch Pc_ref, the on-resistance only increases with increase in the shift amount. Therefore, as shown in FIG. 5, the range of change in on-resistance due to displacement of the relative positions of the repeat regions 40 with respect to the gate electrodes 26 in the arrangement direction of the gate electrodes 26 is smaller than that of the comparative semiconductor device 900. As a result, the variation in on-resistance among the semiconductor devices 1 according to the present embodiment is smaller than the variation in on-resistance among the comparative semiconductor devices 900. Therefore, according to the configuration of the present embodiment, since the cell pitch Pc is different from the repeat pitch Pr, the variation in on-resistance among the semiconductor devices 1 can be reduced.

The semiconductor device 1 according to the present embodiment also achieves the following effects.

The repeat regions 40 are p-type columns, and the p-type columns and the n-type columns 125 composed of the n$^-$-type layers 120 are alternately repeated in the arrangement direction of the gate electrodes 26 to form the super junction structure. Accordingly, when the MOSFET is turned off, the depletion layers are formed in the vicinities of the repeat regions 40. Thus, the breakdown voltage of the semiconductor device 1 is improved.

As shown in FIG. 2, the region thickness Tr is larger than the region width Wr. Accordingly, a range in which the depletion layer spreads in the thickness direction of the n$^+$-type substrate 10 is increased, the breakdown voltage of the semiconductor device 1 is improved and the on-resistance decreases as compared with a case where the region thickness Tr is less than the region width Wr.

The gate electrodes 26 and the repeating regions 40 are configured so as to satisfy a relationship of i×Pc=j×Pr. Accordingly, some of the cell center lines Oc and some of the repeat center lines Or coincide with each other. Therefore, the positions of the some of the gate electrodes 26 and the some of the repeat regions 40 that coincide with each other are easier to use as references as compared with the case where the cell center lines Oc and the repeat center line Or do not coincide with each other. This makes it easier to determine the positional relationship between the gate electrodes 26 and the repeat regions 40, thereby facilitating the manufacture of the gate electrodes 26 and the repeat regions 40. Therefore, it becomes easier to manufacture the semiconductor device 1.

Second Embodiment

A second embodiment differs from the first embodiment in the form of the repeat regions 40. The other configurations are the same as those of the first embodiment.

Figure 8:
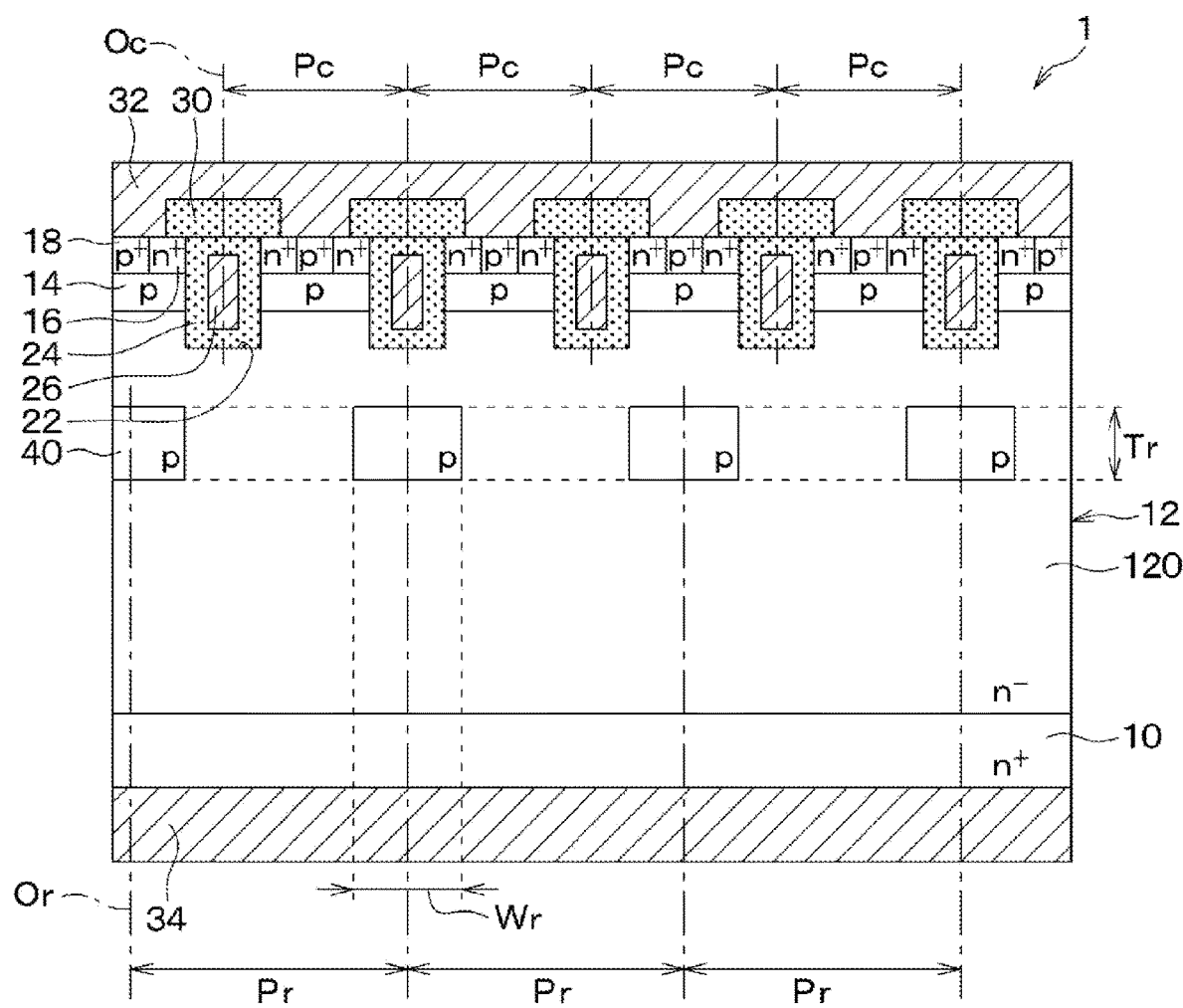
FIG. 8 is a cross-sectional view of a semiconductor device according to a second embodiment.

Specifically, in the semiconductor device 1 according to the second embodiment, the repeat regions 40 are deep layers sandwiching the n⁻-type layer 120 in the arrangement direction of the gate electrodes 26 instead of the p-type columns. The p-type impurity concentration of the repeat region 40 is, for example, the same as the p-type impurity concentration of the p-type base regions 14, and is $2.0 \times 10^{17}/\text{cm}^3$. Furthermore, as shown in FIG. 8, the region width Wr is larger than the region thickness Tr, for example, 1.5 times or more the region thickness Tr. Note that the deep layer is sometimes called an electric field relaxation layer.

The semiconductor device 1 of the second embodiment is configured as described above. The second embodiment achieves effects similar to the effects achieved by the first embodiment. The second embodiment also achieves the following effects.

The repeat regions 40 are the deep layers. Accordingly, even if a high voltage is applied, an electric field can be restricted from entering the bottom portions of the gate trenches 22. Therefore, electric field concentration at the bottom portions of gate trenches 22 can be relaxed. Therefore, breakdown of the gate insulating films 24 can be restricted.

The region width Wr is larger than the region thickness Tr. Accordingly, the movement of electrons flowing through the n⁻-type layer 120 is less likely to be interfered by the repeat regions 40, and the on-resistance can be reduced as compared with the case where the region width Wr is equal to or less than the region thickness Tr.

Third Embodiment

Figure 9:
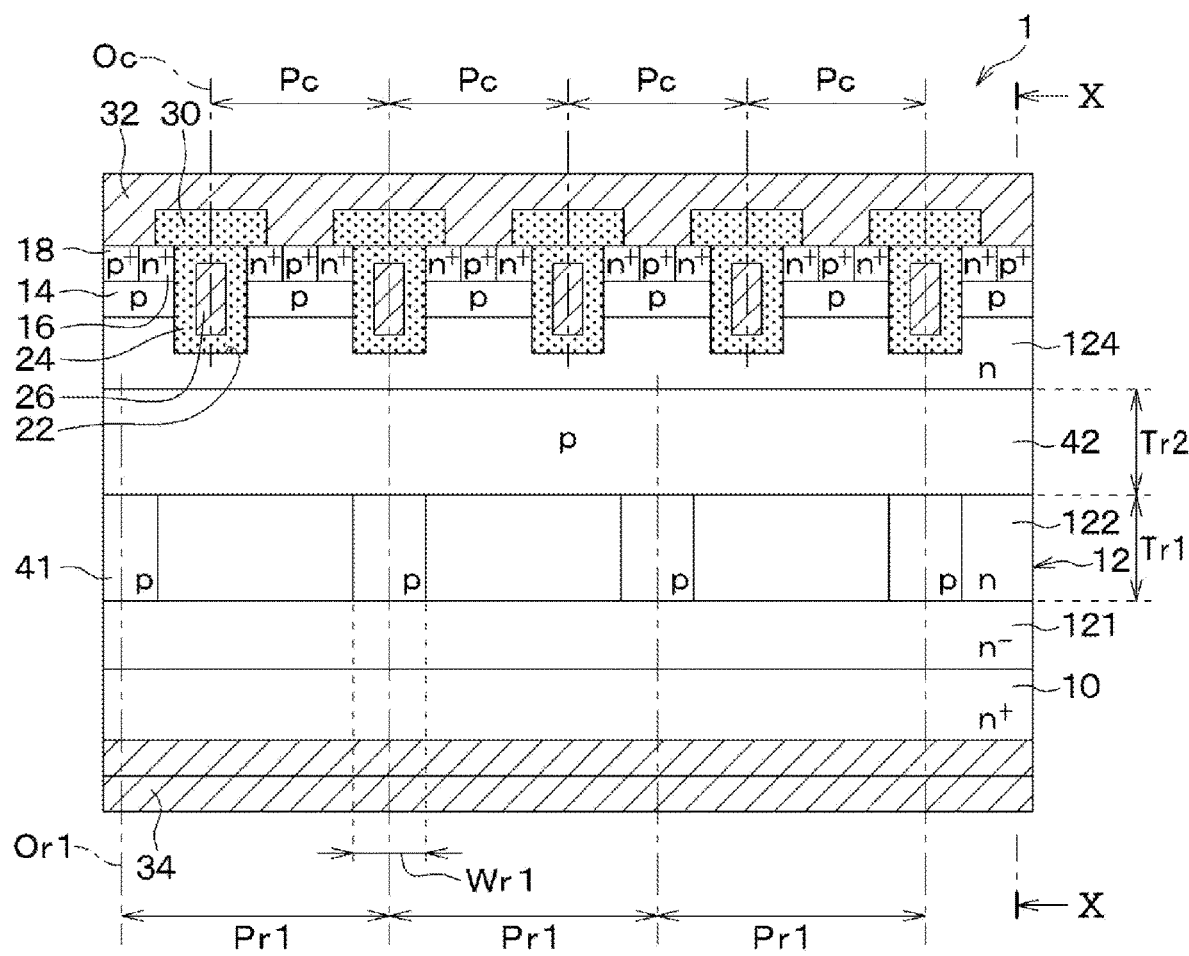
FIG. 9 is a cross-sectional view of a semiconductor device according to a third embodiment.
Figure 10:
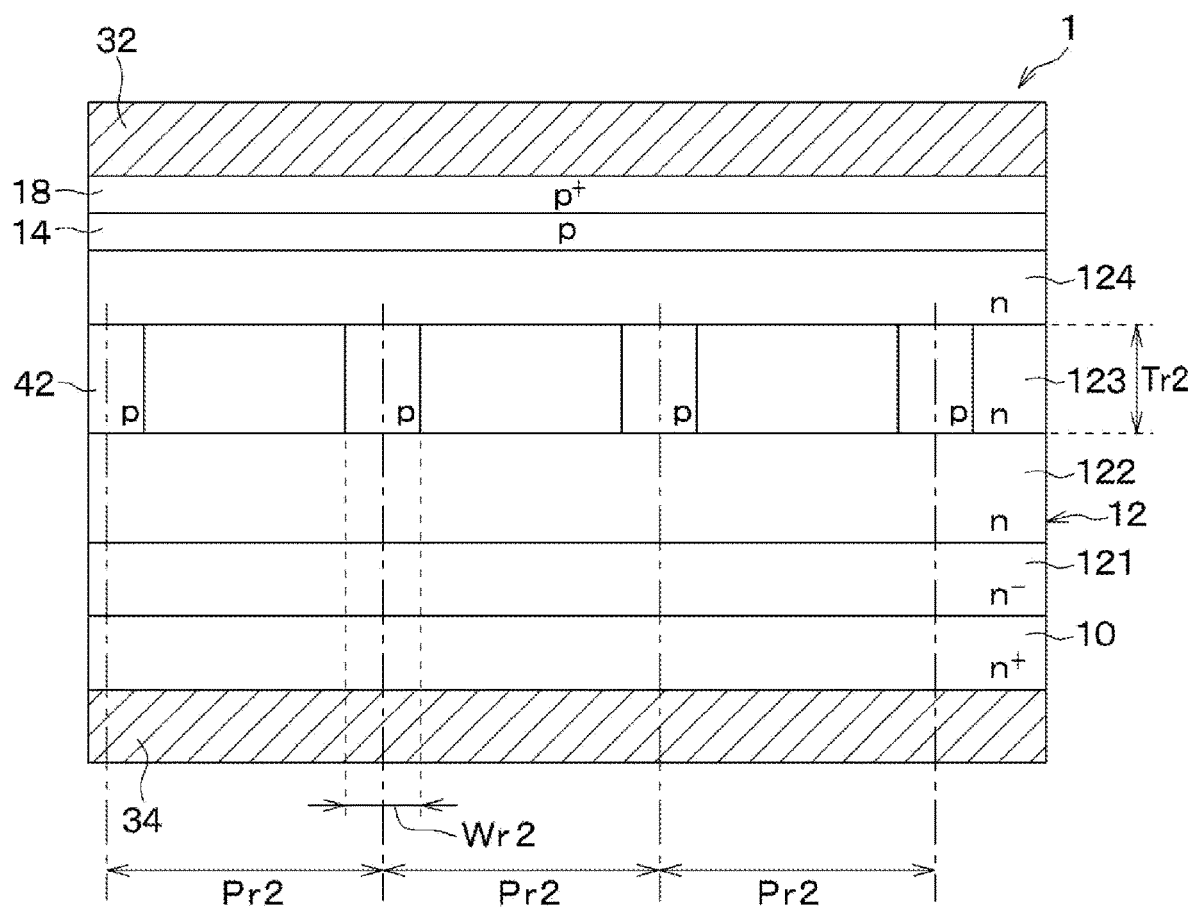
FIG. 10 is a cross-sectional view of the semiconductor device taken along line X-X in FIG. 9.

In a third embodiment, as shown in FIG. 9 and FIG. 10, the drift layer 12 includes a first n⁻-type layer 121, a second n-type layer 122, a third n-type layer 122, and an n-type current diffusion layer 124 instead of the n⁻-type layer 120. The semiconductor device 1 also includes first repeat regions 41 and second repeat regions 42 instead of the repeat regions 40. The other configurations are similar to those of the first embodiment.

The first n-type layer 121 is formed of SiC on the front surface of the n⁺-type substrate 10 in the cell region RC and the outer peripheral region RG. The first n-type layer 121 has an n-type impurity concentration that is lower than the n-type impurity concentration of the n⁺-type substrate 10. The n-type impurity concentration of the first n-type layer 121 is, for example, $5.0 \times 10^{15}$ to $2.0 \times 10^{16}/\text{cm}^3$.

The second n-type layer 122 is formed of SiC on a surface of the first n-type layer 121. The second n-type layer 122 has an n-type impurity concentration that is higher than the n-type impurity concentration of the first n-type layer 121 and is lower than the n-type impurity concentration of the n⁺-type substrate 10.

The third n-type layer 123 is formed of SiC on a surface of the second n-type layer 122 and surfaces of the first repeat regions 41. The third n-type layer 123 has an n-type impurity concentration same as the n-type impurity concentration of the second n-type layer 122. Therefore, the n-type impurity concentration of the third n-type layer 123 is higher than the n-type impurity concentration of the first n-type layer 121 and is lower than the n-type impurity concentration of the n⁺-type substrate 10.

The n-type current diffusion layer 124 expands the range in which electric current flow when the MOSFET is turned on. Specifically, the n-type current diffusion layer 124 is formed of SiC on a surface of the third n-type layer 123 and surfaces of the second repeat regions 42. The n-type current diffusion layer 124 is arranged between the p-type base regions 14 and the third n-type layer 123 and the second repeat regions 42 in the thickness direction of the n⁺-type substrate 10. The n-type current diffusion layer 124 has an n-type impurity concentration that is higher than the n-type impurity concentrations of the second n-type layer 122 and the third n-type layer 123 and is lower than the n-type impurity concentration of the n⁺-type substrate 10. The n-type impurity concentration of the n-type current diffusion layer 214 is, for example, $5.0 \times 10^{16}$ to $1.5 \times 10^{17}/\text{cm}^3$ The n-type current diffusion layer 124 has a thickness of, for example, 300 nm to 700 nm. The gate trenches 22 penetrate the p-type base regions 14 and n⁺-type source regions 16 to reach the n-type current diffusion layer 124 instead of reaching the n⁻-type layer 120.

The first repeat regions 41 are formed of SiC in the cell region RC. The first repeat regions 41 are formed in the second n-type layer 122 by ion implantation of p-type impurities. The first repeat region 41 has a p-type impurity concentration that is, for example, the same as the p-type impurity concentration of the repeat region 40, and is $2.0 \times 10^{15}$ to $5.0 \times 10^{15}/\text{cm}^3$. The first repeat regions 41 are connected to the source electrode 32 through a coupling layer (not shown) and the second repeat regions 42. Accordingly, first p-type columns composed of the first repeat regions 41 and first n-type columns composed of the second n-type layer 122 are alternately repeated to form a first super junction structure.

The second repeat regions 42 are formed of SiC in the cell region RC. The second repeat regions 42 are formed in the third n-type layer 123 by ion implantation of p-type impurities. The second repeat regions 42 are arranged in a direction orthogonal to an arrangement direction of the first repeat regions 41. The second repeat regions 42 extend in the arrangement direction of the first repeat regions 41. The second repeat regions 42 has a p-type impurity concentration that is, for example, the same as the p-type impurity concentration of the first repeat regions 41. The second repeat regions 42 are connected to the source electrode 32 through a coupling layer (not shown). Accordingly, second p-type columns composed of the second repeat regions 42 and second n-type columns composed of the third n-type layer 123 are alternately repeated to form a second super junction structure. The p-type impurity concentration of the second repeat regions 42 may be different from the p-type impurity concentration of the first repeat regions 41.

Here, center lines each of passing through a centers of each of the first repeat regions 41 in the arrangement direction of the gate electrodes 26 and extending in the thickness direction of the n⁺-type substrate 10 are defined as first repeat center lines Or1. A distance between adjacent two of the first repeat center lines Or1 in the arrangement direction of the gate electrodes 26 is defined as a first repeat pitch Pr1. In addition, center lines each of passing through a center of each of the second repeat regions 42 in the arrangement direction of the gate electrodes 26 and extending in the thickness direction of the n⁺-type substrate 10 are defined as second repeat center lines Or2. A distance between adjacent two of the second repeat center lines Or2 in the arrangement direction of the gate electrodes 26 is defined as a second repeat pitch Pr2. A width of each of the first repeat regions 41 is defined as a first region width Wr1. A thickness of each of the first repeat regions 41 is defined as a first region thickness Tr1. A width of each of the second repeat regions 42 is defined as a second region width Wr2. A thickness of each of the second repeat regions 42 is defined as a second region thickness Tr2. The first region width Wr1 is the length of each of the first repeat regions 41 in the arrangement direction of the first repeat regions 41, and is the length in the horizontal direction in FIG. 9. The first region thickness Tr1 is the length of each of the first repeat regions 41 in the thickness direction of the n$^+$-type substrate 10, and is the length in the vertical direction in FIG. 9. The second region width Wr2 is the length of each of the second repeat regions 42 in the arrangement direction of the second repeat regions 42, that is, a direction orthogonal to the arrangement direction of the first repeat region 41, and is the length in the horizontal direction in FIG. 10. The second region thickness Tr3 is the length of each of the second repeat regions 42 in the thickness direction of the n$^+$-type substrate 10, and is the length in the vertical direction in FIG. 9.

The first repeat pitch Pr1 and the second repeat pitch Pr2 are, for example, 1.2 to 3.0 μm, similarly to the repeat pitch Pr. The first repeat pitch Pr1 may be the same as the second repeat pitch Pr2. Alternatively, the first repeat pitch Pr1 may be different from the second repeat pitch Pr2.

The cell pitch Pc is different from the first repeat pitch Pr1 and the second repeat pitch Pr2. Therefore, relationships of Pc≠Pr1 and Pc≠Pr2 are established. The first region width Wr1 is approximately half the first repeat pitch Pr1. The first region thickness Tr1 is larger than the first region width Wr1, and is, for example, 1.5 times or more the first region width Wr1. In addition, a relationship of i×Pc=j×Pr1 is established. Therefore, the cell center lines Oc coincide with the first repeat center lines Or1 at intervals of the value of i×Pc=j×Pr1. The value of i×Pc=j×Pr1 is preferably 3 μm or more. The second region width Wr2 is approximately half the second repeat pitch Pr2. The second region thickness Tr2 is larger than the second region width Wr2, and is, for example, 1.5 times or more the second region width Wr2.

The semiconductor device 1 of the third embodiment is configured as described above. The third embodiment achieves effects similar to the effects achieved by the first embodiment. The third embodiment also achieves the following effects.

In addition to the first super junction structure, the second super junction structure is formed in which the second p-type columns composed of the second repeat regions 42 and the second n-type columns composed of the third n-type layer 123 are alternately repeated. Accordingly, when the MOSFET is turned off, depletion layers are formed in the vicinities of the second repeat regions 42 in addition to the vicinities of the second repeat regions 42. Therefore, the breakdown voltage of the semiconductor device 1 can be improved compared with a case where the second repeat regions 42 are not formed.

The drift layer 12 has the n-type current diffusion layer 124 arranged between the third n-type layer 123 and the p-type base regions 14 in the thickness direction of the n$^+$-type substrate 10. Accordingly, when the MOSFET in the semiconductor device 1 is turned on and the channel regions are formed in the p-type base regions 14, electrons injected from the source electrode 32 reach the n-type current diffusion layer 124 after passing through the channel regions. Since the n-type current diffusion layer 124 expands the range in which electric current flows, the electric current can flow to a position apart from the trench gate structure, and the on-resistance of the semiconductor device 1 can be reduced.

Fourth Embodiment

A fourth embodiment differs from the third embodiment in the form of the second repeat regions 42. The other configurations are the same as those of the third embodiment.

Specifically, the second repeat region 42 are deep layers instead of the second p-type columns. Therefore, the third n-type layer 123 that is alternately arranged with the second repeat regions 42 functions as a junction field effect transistor (JFET) portion.

Figure 11:
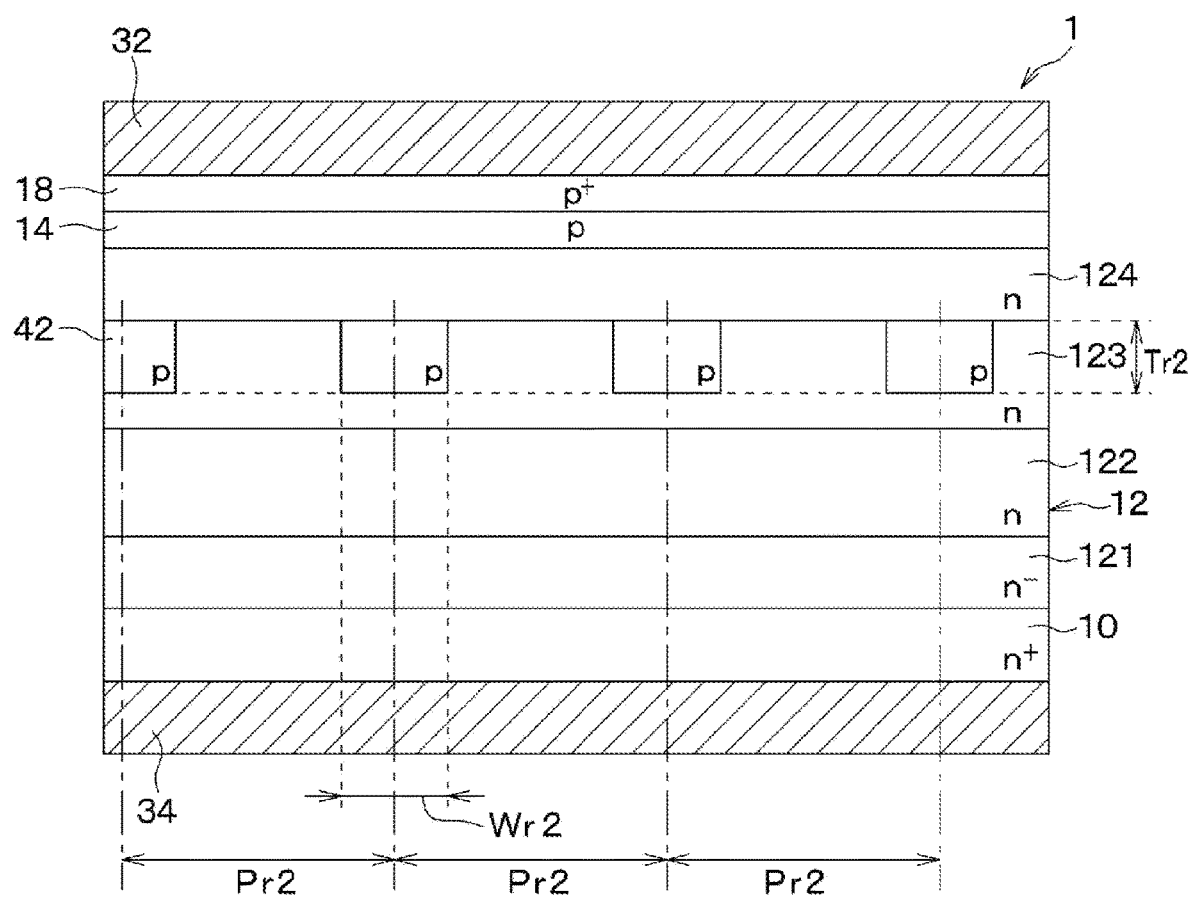
FIG. 11 is a cross-sectional view of a semiconductor device according to a fourth embodiment.

The p-type impurity concentration of the second repeat regions 42 is, for example, the same as the p-type impurity concentration of the p-type base regions 14, and is 2.0×10$^{17}$/cm$^3$. Furthermore, as shown in FIG. 11, the second region width Wr2 is larger than the second region thickness Tr2, and is 1.5 times or more the second region thickness Tr2.

The semiconductor device 1 of the fourth embodiment is configured as described above. The fourth embodiment achieves effects similar to the effects achieved by the third embodiment. The fourth embodiment also achieves the following effects.

The second repeat region 42 arranged between the gate trenches 22 and the first repeat regions 41 in the thickness direction of the n$^+$-type substrate 10 are the deep layers. Accordingly, even if a high voltage is applied, an electric field can be restricted from entering the bottom portions of the gate trenches 22 from the second n-type layer 122 between the first repeat regions 41. Therefore, electric field concentration at the bottom portions of gate trenches 22 can be relaxed. Therefore, breakdown of the gate insulating films 24 can be restricted.

Fifth Embodiment

A fifth embodiment differs from the first embodiment in the form of the repeat regions 40. The other configurations are the same as those of the first embodiment.

Figure 12:
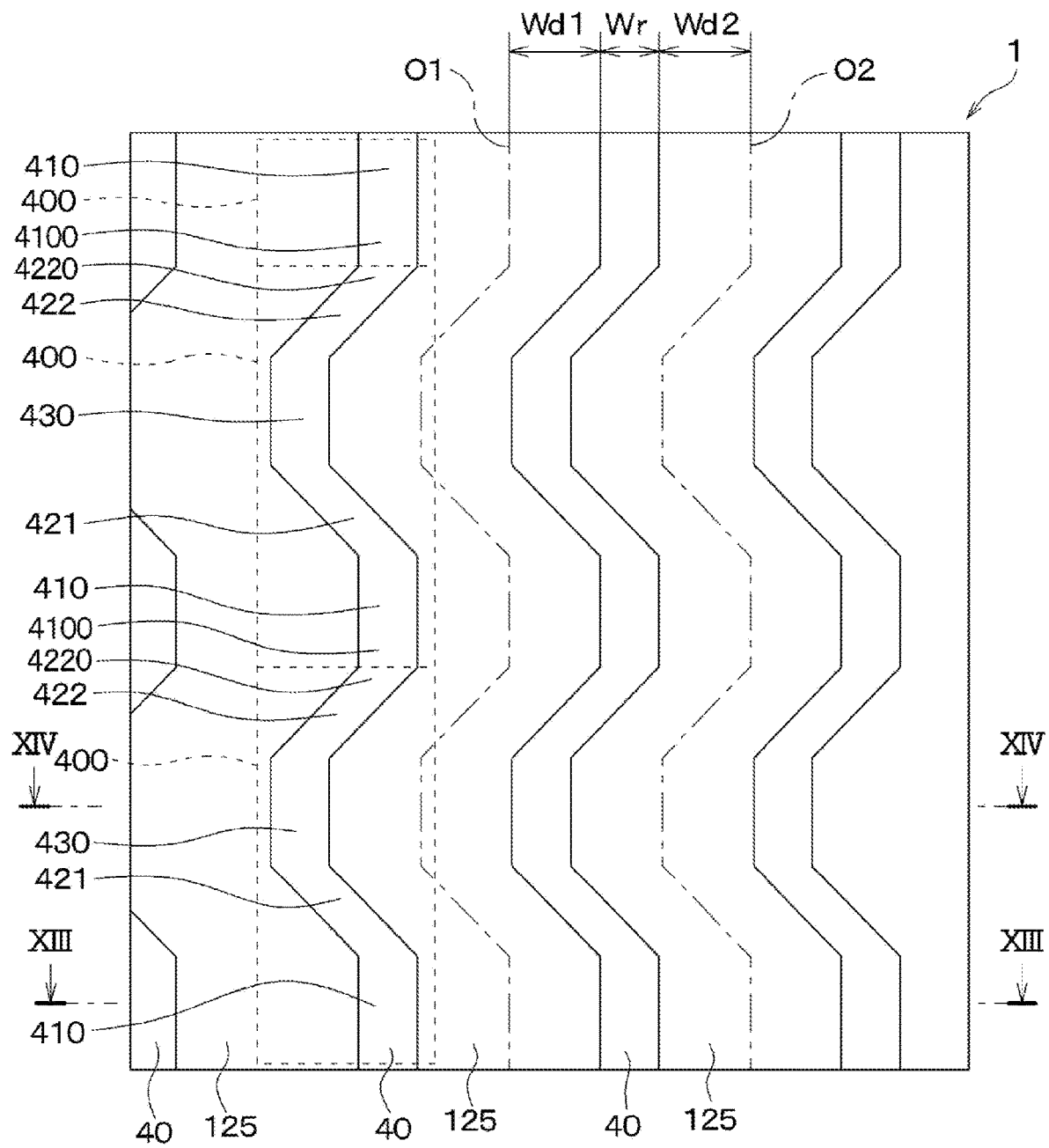
FIG. 12 is an upper surface layout diagram of a semiconductor device according to a fifth embodiment.
Figure 13:
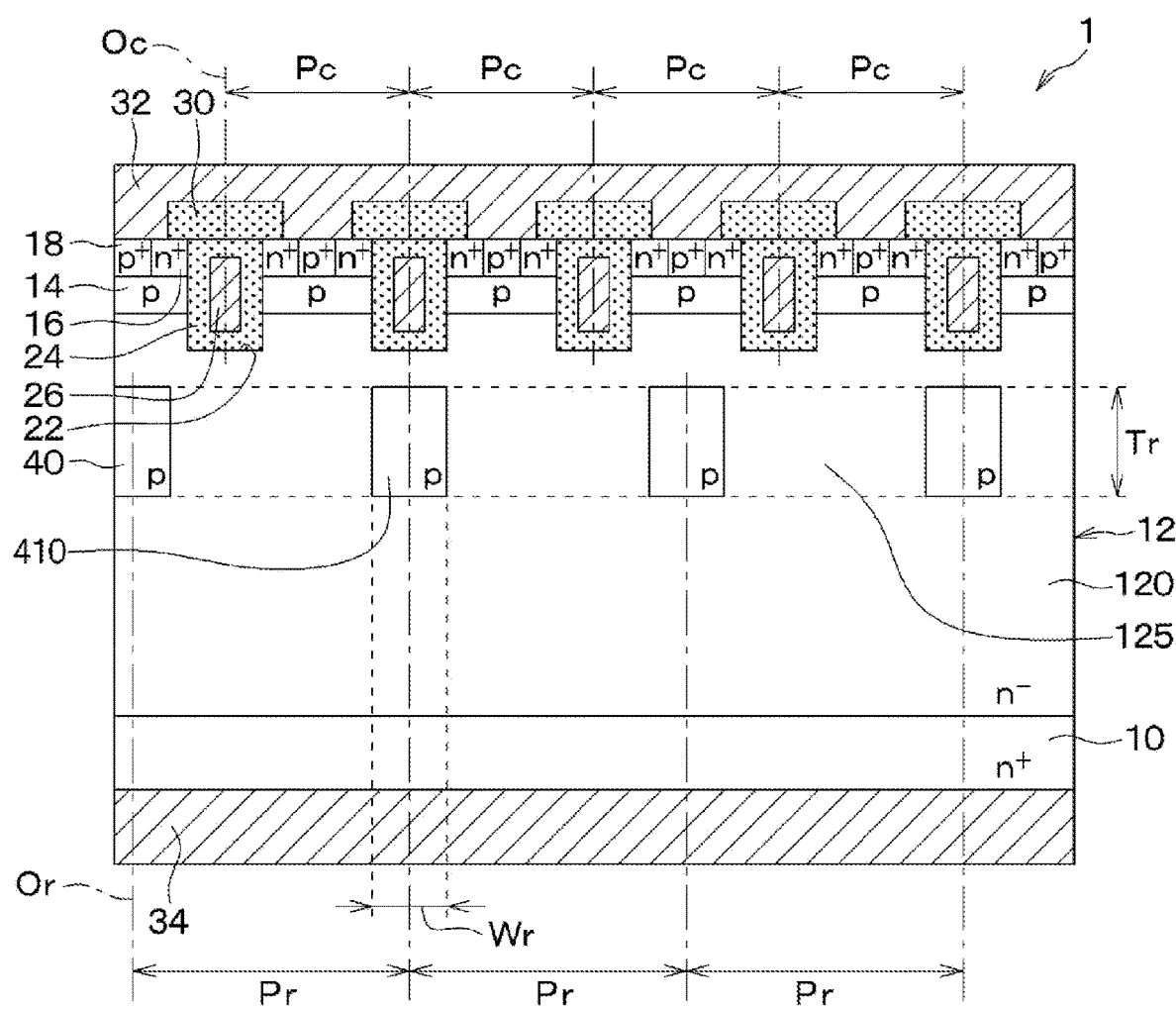
FIG. 13 is a cross-sectional view of the semiconductor device taken along line XIII-XIII of FIG. 12.
Figure 14:
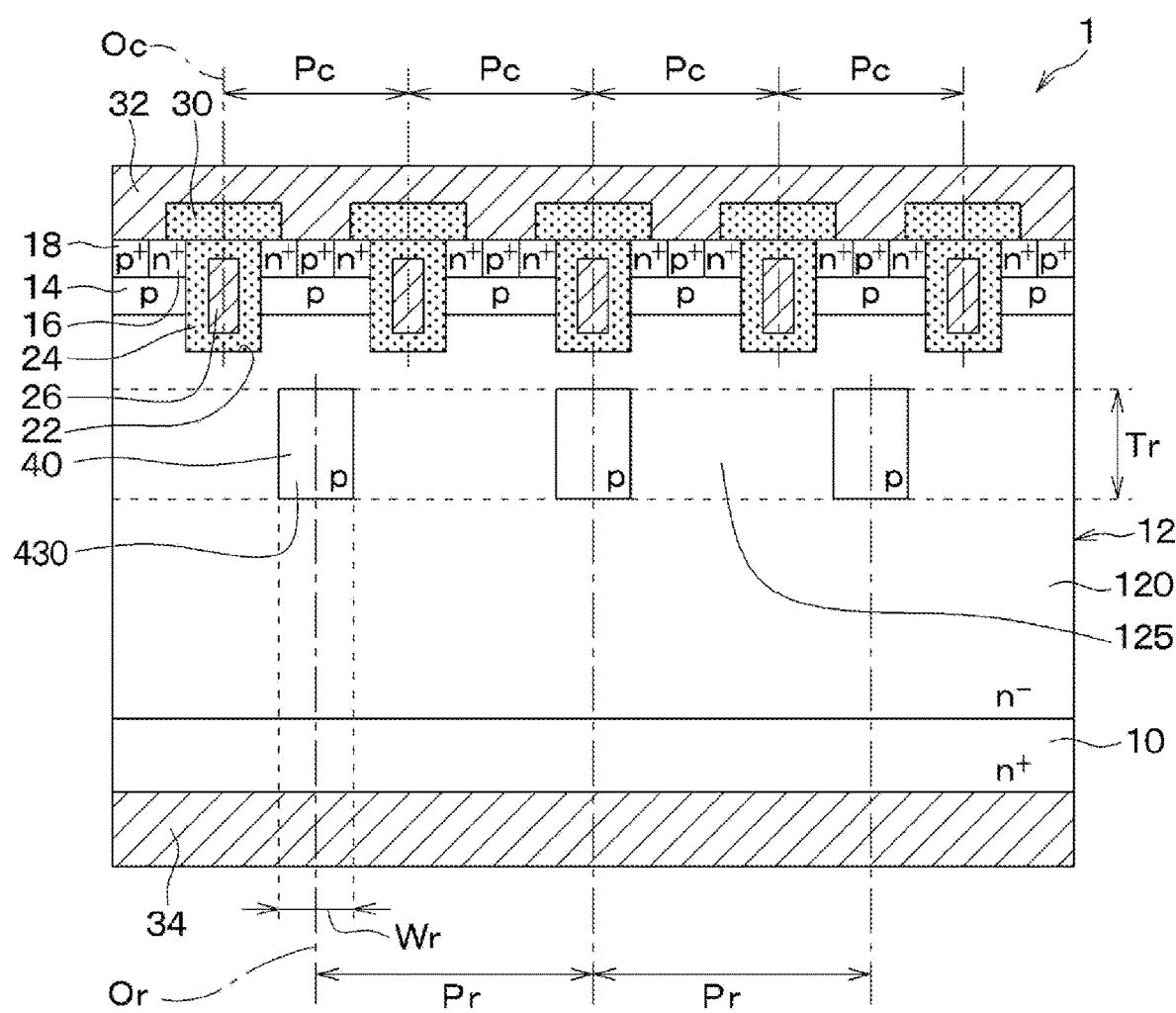
FIG. 14 is a cross-sectional view of the semiconductor device taken along line XIV-XIV of FIG. 12.

Specifically, each of the repeat regions 40 has a plurality of wavy sections 400, as shown in FIG. 12, FIG. 13, and FIG. 14. The wavy sections 400 are connected each other and arranged in a direction orthogonal to the arrangement direction of the gate electrodes 26. The direction orthogonal to the arrangement direction of the gate electrodes 26 is an example of an intersection direction that is a direction intersecting the arrangement direction of the gate electrodes 26.

Each of the wavy sections 400 includes a straight portion 410, a first inclined portion 421, an intermediate portion 430, and a second inclined portion 422. The straight portion 410 extends in a direction orthogonal to the arrangement direction of the gate electrodes 26. The first inclined portion 421 is connected with the straight portion 410. The first inclined portion 421 extends from a boundary with the straight portion 410 while being inclined with respect to the direction orthogonal to the arrangement direction of the gate electrodes 26. The intermediate portion 430 is connected with the first inclined portion 421. The intermediate portion 430 extends from a boundary with the first inclined portion 421 in the direction in which the straight portion 410 extends, that is, in the direction orthogonal to the arrangement direction of the gate electrodes 26. The second inclined portion 422 is connected with the intermediate portion 430. The second inclined portion 421 extends from a boundary with the intermediate portion 430 while being inclined with respect to the direction orthogonal to the arrangement direction of the gate electrodes 26. The second inclined portion 422 has a shape symmetrical to the first inclined portion 421 in the direction orthogonal to the arrangement direction of the gate electrodes 26 with respect to the intermediate portion 430. Therefore, an inclination angle of the second inclined portion 422 is the same as an inclination angle of the first inclined portion 421. An end 4220 of the second inclined portion 422 opposite to the intermediate portion 430 in one of the wavy sections 400 is connected with an end 4100 of the straight portion 410 opposite to the first inclined portion 421 in adjacent one of the wavy sections 400. Accordingly, the wavy sections 400 adjacent to each other are connected and arranged in the direction orthogonal to the arrangement direction of the gate electrodes 26.

The p-type impurity concentration of the repeat regions 40 is defined as Nr. The n-type impurity concentration of the n⁻-type layer 120 and the n-type columns 125 is defined as Nd. A center line passing through a center between adjacent two of the repeat regions 40 in the arrangement direction of the gate electrodes 26 and extending in a direction along the wavy sections 400 is defined as a first center line O1. A center line adjacent to the first center line O1 in the arrangement direction of the gate electrodes 26 is defined as a second center line O2. A distance from the first center line O1 to the repeat region 40 located between the first center line O1 and the second center line O2 in the arrangement direction of the gate electrodes 26 is defined as a first distance Wd1. A distance from the second center line O2 to the repeat region 40 located between the first center line O1 and the second center line O2 in the arrangement direction of the gate electrodes 26 is defined as a second distance Wd2. The sum of the first distance Wd1 and the second distance Wd2, that is, Wd1+Wd2 is defined as Wd.

The n⁻-type layer 120, the n-type columns 125 and the repeat regions 40 are configured to as to satisfy a relationship of α×Nr×Wr=Nd×Wd. Note that α is a coefficient within a range from 0.5 to 1.5. Wr is the region width, as described above, and corresponds to the length of each of the repeat regions 40 in the arrangement direction of the gate electrodes 26.

The semiconductor device 1 of the fifth embodiment is configured as described above. The fifth embodiment achieves effects similar to the effects achieved by the first embodiment. The fifth embodiment also achieves the following effects.

If a dimension of a region between each of the gate electrodes 26 and adjacent one of the repeat regions 40 is smaller than a dimension of a region between adjacent two of the repeat regions 40, increase and constriction of current paths are likely to occur in the region between each of the gate electrodes 26 and adjacent one of the repeat regions 40. Accordingly, the resistance increases in the region between each of the gate electrodes 26 and adjacent one of the repeat regions 40, so that electric current flowing between the source electrode 32 and the drain electrode 34 tends to be non-uniform. Therefore, the on-resistance of the semiconductor device 1 increases.

On the other hand, in the semiconductor device 1 of the fifth embodiment, each of the repeat regions 40 has the wavy sections 400, and each of the wavy sections 400 includes the straight portion 410, the first inclined portion 421, the intermediate portion 430, and the second inclined portion 422.

Figure 15:
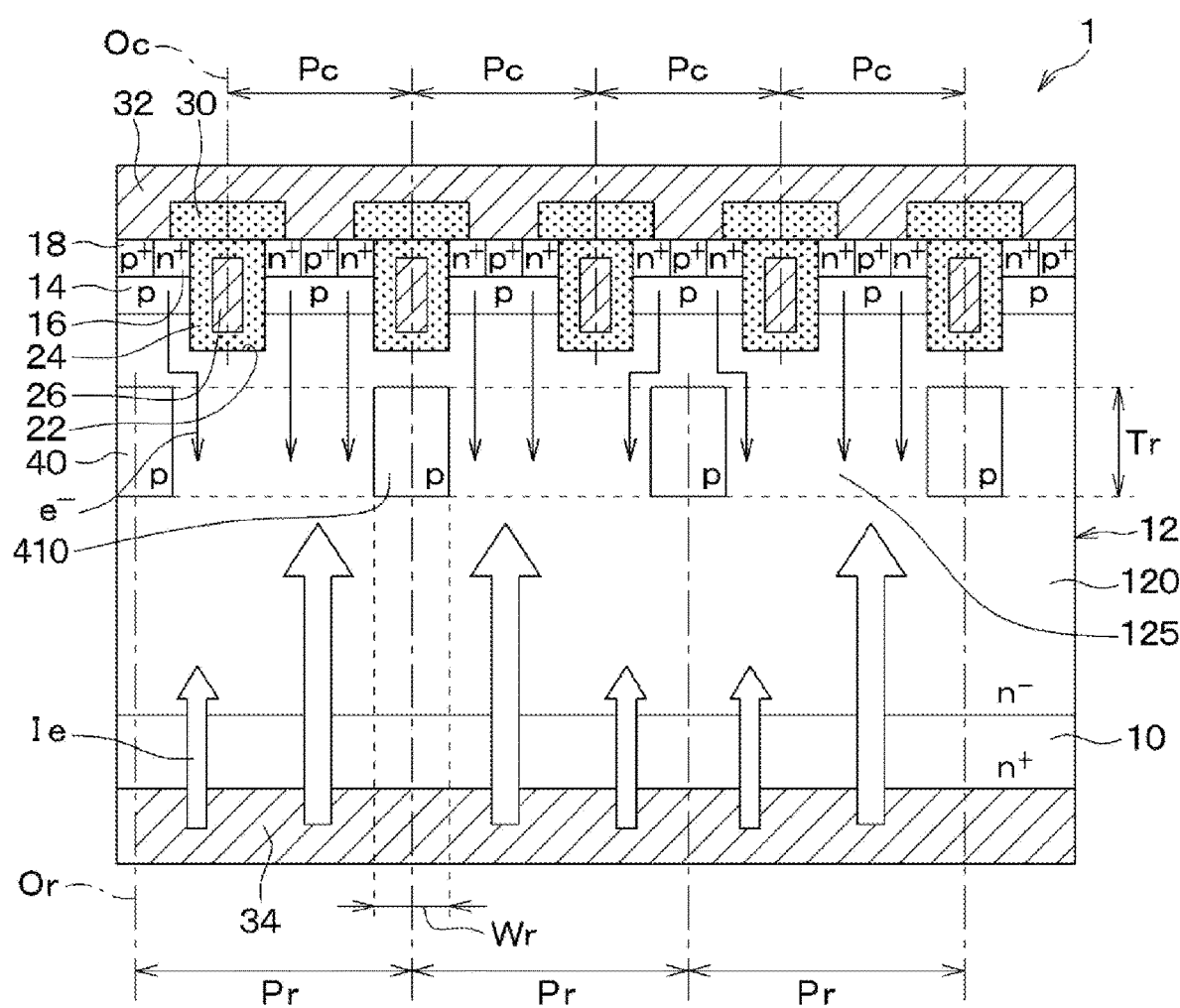
FIG. 15 is a diagram schematically showing electrons and electric currents that flow in the semiconductor device.
Figure 16:
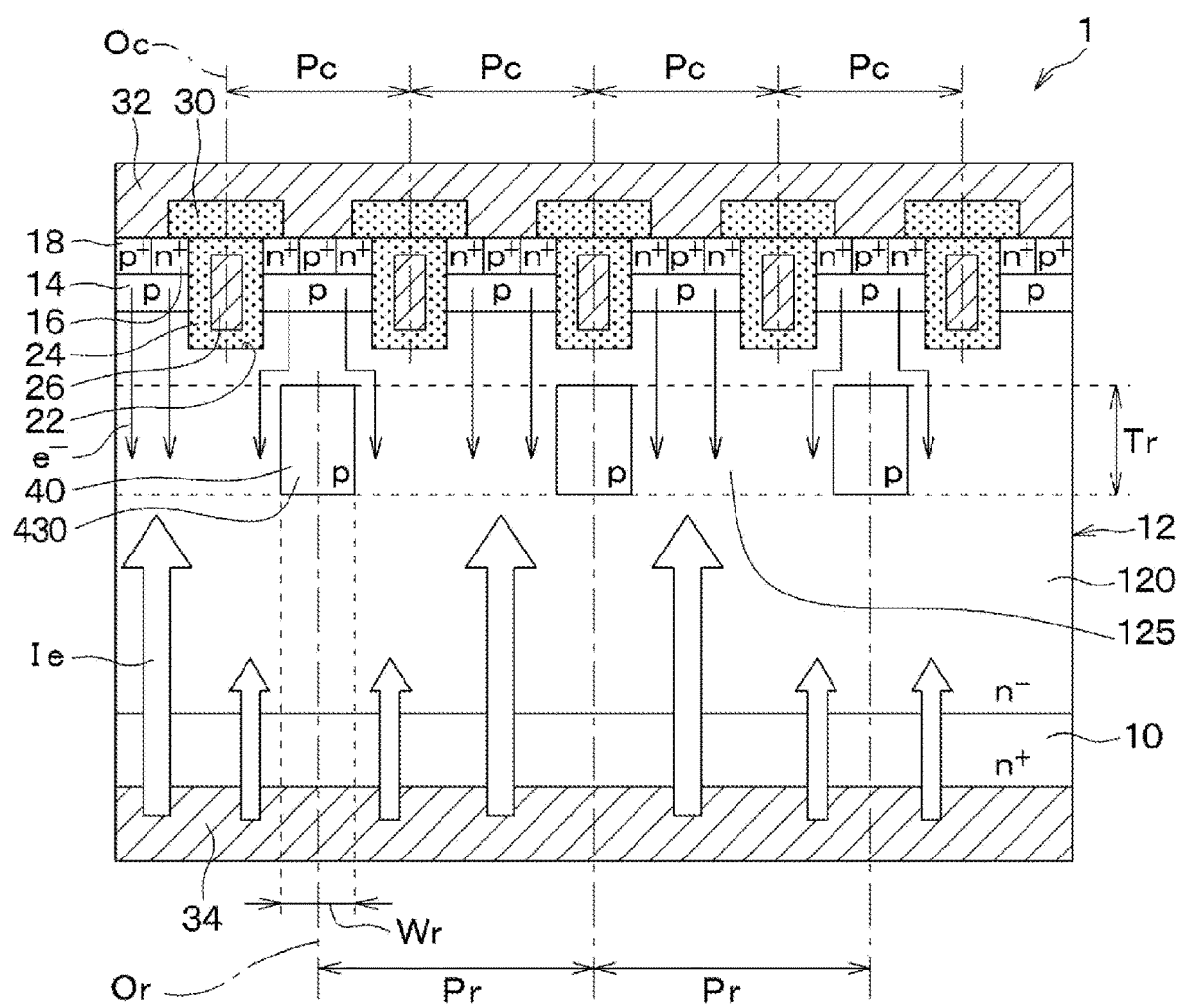
FIG. 16 is a diagram schematically showing electrons and electric currents that flow in the semiconductor device.

Accordingly, the relative positions of the repeat regions 40 with respect to the gate electrodes 26 change depending on the position in the direction orthogonal to the arrangement direction of the gate electrodes 26. Therefore, a portion where the resistance increases in the region between each of the gate electrodes 26 and adjacent one of the repeat regions 40 is likely to disperse as compared with a case where each of the repeat regions 40 is formed into a straight line extending in the direction orthogonal to the arrangement direction of the gate electrodes 26. Therefore, as shown in FIG. 15 and FIG. 16, electrons and electric currents flowing between the source electrode 32 and the drain electrode 34 tend to be uniform as a whole. Thus, the increase in the on-resistance of the semiconductor device 1 can be restricted. In FIG. 15 and FIG. 16, the flow of electrons is schematically indicated by e⁻ and arrows. In addition, the flow of electric currents is schematically indicated by Ie and arrows.

Each of the wavy sections 400 includes the intermediate portion 430. The intermediate portion 430 is connected with the first inclined portion 421 and the second inclined portion 422 and extends in the direction in which the straight portion 410 extends, here in the direction orthogonal to the arrangement direction of the gate electrodes 26.

Accordingly, corners of the first inclined portion 421 and the second inclined portion 422 can be gentler as compared with a case where the first inclined portion 421 and the second inclined portion 422 are directly connected with each other. Therefore, electric field concentration at the corners of the first inclined portion 421 and the second inclined portion 422 can be relaxed.

The n-type columns 125 and the repeat regions 40 are configured so as to satisfy the relationship of α×Nr×Wr=Nd×Wd.

Accordingly, the balance of the charge amounts of the n-type columns 125 and the repeat regions 40 can be easier to ensured. Therefore, a decrease in the breakdown voltage of the semiconductor device 1 can be restricted.

Modifications of Fifth Embodiment

Figure 17:
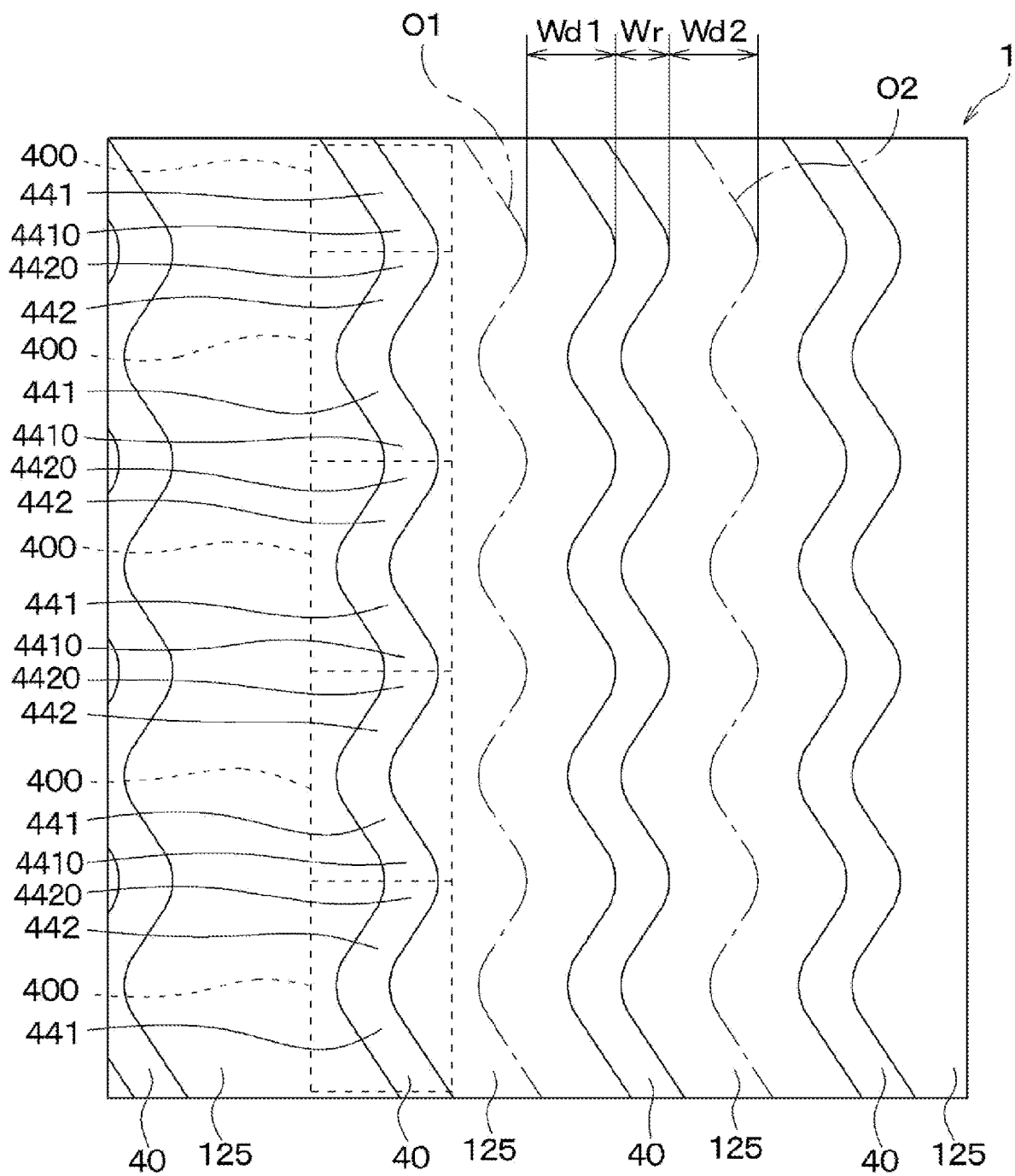
FIG. 17 is an upper surface layout diagram of a part of a semiconductor device according to a modification of the fifth embodiment.

In a modification of the fifth embodiment, as shown in FIG. 17, each of the wavy sections 400 may include a first curved portion 441 and a second curved portion 442 instead of the straight portion 410, the first inclined portion 421, the intermediate portion 430, and the second inclined portion 422.

The first curved portion 441 extends in a curved manner so that a tangent to the first curved portion 441 is inclined with respect to the direction orthogonal to the arrangement direction of the gate electrodes 26. The second curved portion 442 is connected with the first curved portion 441. The second curved portion 442 extends from a boundary with the first curved portion 441 in a curved manner so that a tangent to the second curved portion 442 is inclined with respect to the direction orthogonal to the arrangement direction of the gate electrodes 26. The second curved portion 442 has a shape symmetrical to the first curved portion 441 in a direction orthogonal to the arrangement direction of the gate electrodes 26 with respect to the boundary with the first curved portion 441. Furthermore, an end 4420 of the second curved portion 442 opposite to the first curved portion 441 is connected with an end 4410 of the first curved portion 441 opposite to the second curved portion 442 in the adjacent wavy section 400. Accordingly, the adjacent wavy sections 400 are connected and arranged in the direction orthogonal to the arrangement direction of the gate electrodes 26. In the above-described configuration, effects similar to the effects achieved by the fifth embodiment can be achieved. Note that the term "symmetrical" includes a manufacturing error range.

Figure 18:
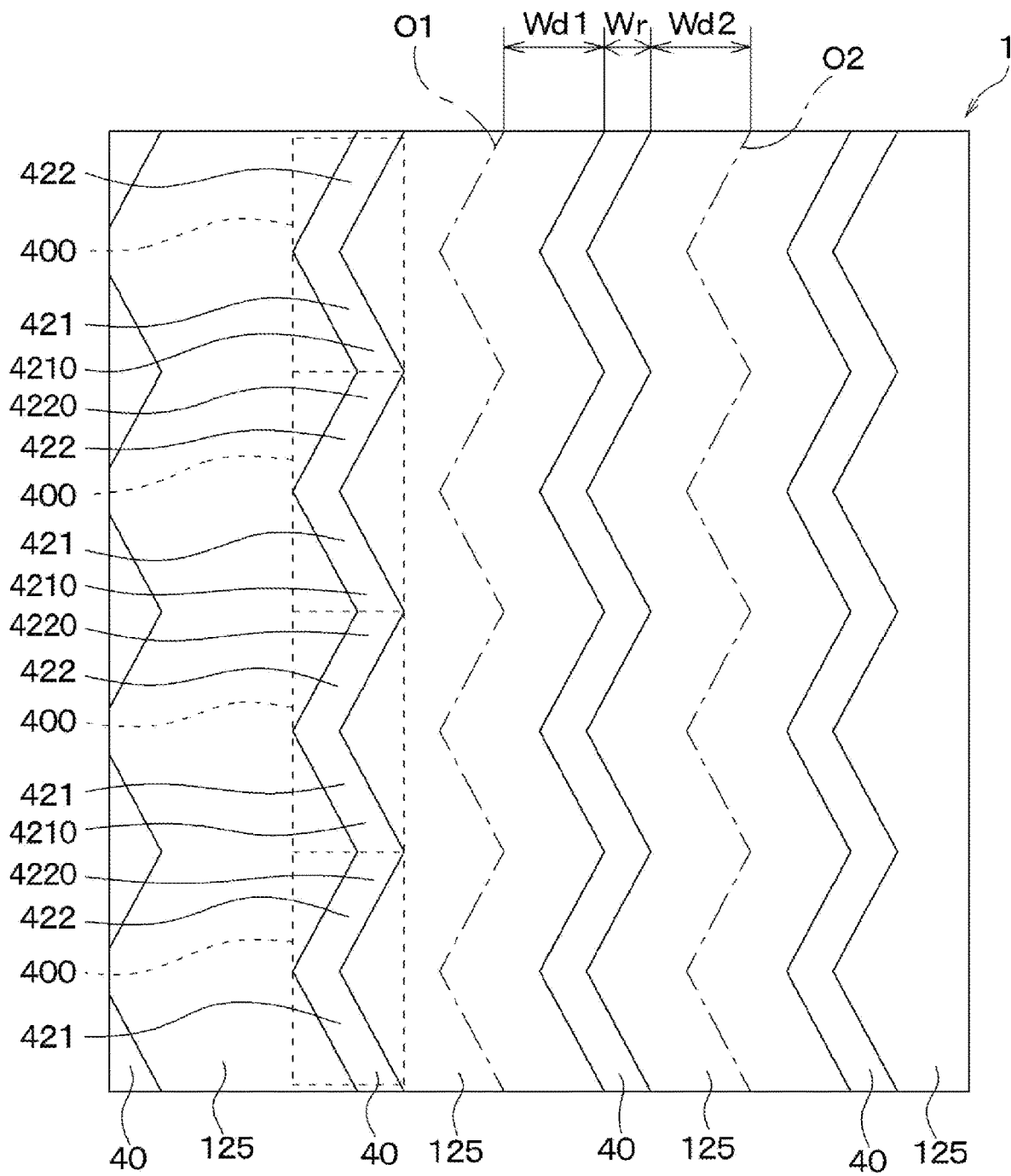
FIG. 18 is an upper surface layout diagram of a part of a semiconductor device according to another modification of the fifth embodiment.

In another modification of the fifth embodiment, as shown in FIG. 18, each of the wavy sections 400 may include only the first inclined portion 421 and the second inclined portion 422 without the straight portion 410 and the intermediate portion 430. In this case, the first inclined portion 421 extends while being inclined with respect to the direction orthogonal to the arrangement direction of the gate electrodes 26. The second inclined portion 422 is connected with the first inclined portion 421. The second inclined portion 421 extends from a boundary with the first inclined portion 421 while being inclined with respect to the direction orthogonal to the arrangement direction of the gate electrodes 26. The second inclined portion 422 has a shape symmetrical to the first inclined portion 421 in a direction orthogonal to the arrangement direction of the gate electrodes 26 with respect to the boundary with the first inclined portion 421. The end 4220 of the second inclined portion 422 opposite to the first inclined portion 421 in one of the wavy sections 400 is connected with the end 4210 of the first inclined portion 421 opposite to the second inclined portion 422 in adjacent one of the wavy sections 400. Accordingly, the wavy sections 400 adjacent to each other are connected and arranged in the direction orthogonal to the arrangement direction of the gate electrodes 26. Also in the above-described configuration, effects similar to the effects achieved by the fifth embodiment can be achieved.

Sixth Embodiment

A sixth embodiment differs from the fifth embodiment in the form of the repeat regions 40. The other configurations are the same as those of the fifth embodiment.

Figure 19:
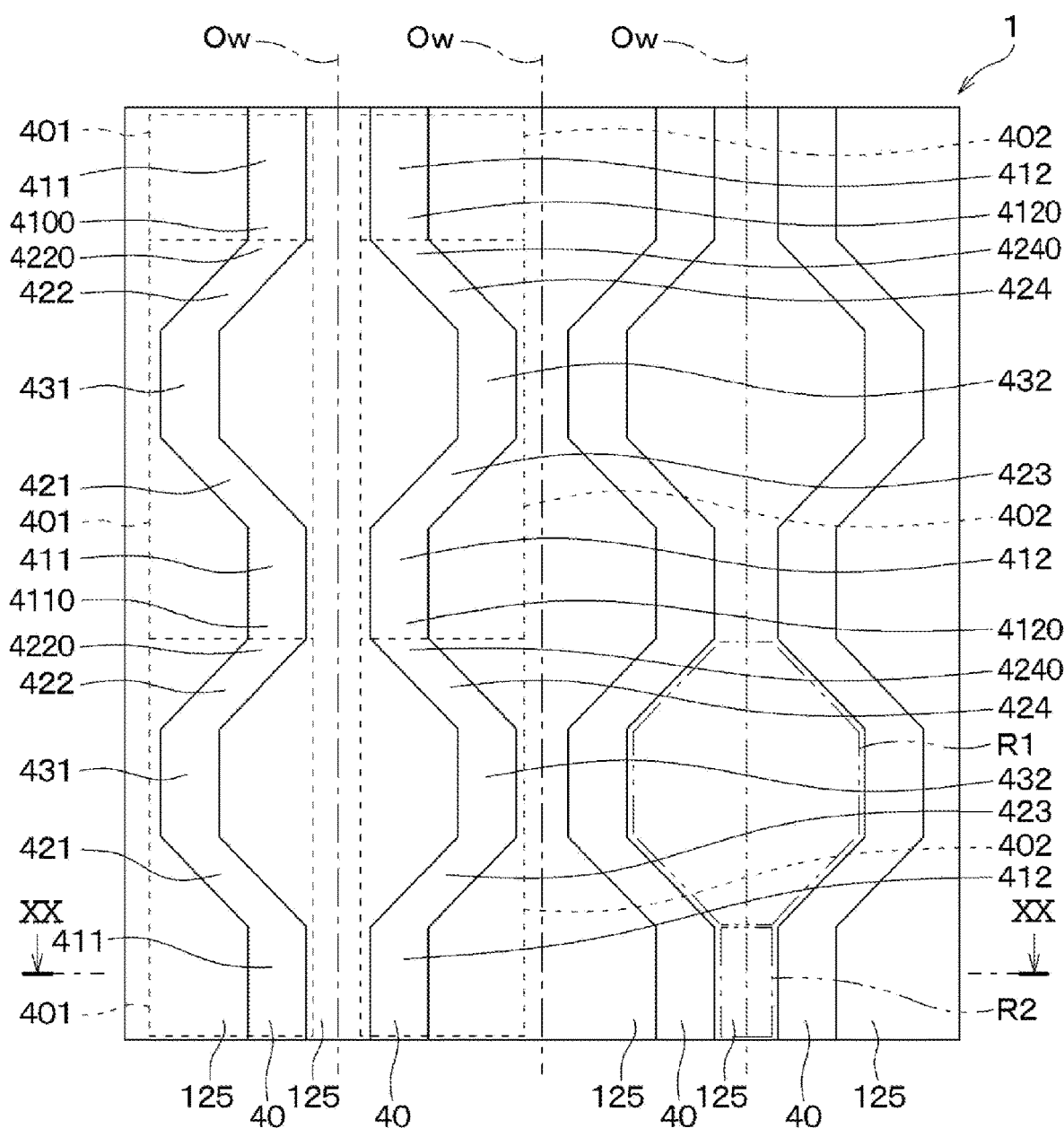
FIG. 19 is an upper surface layout diagram of a semiconductor device according to a sixth embodiment.
Figure 20:
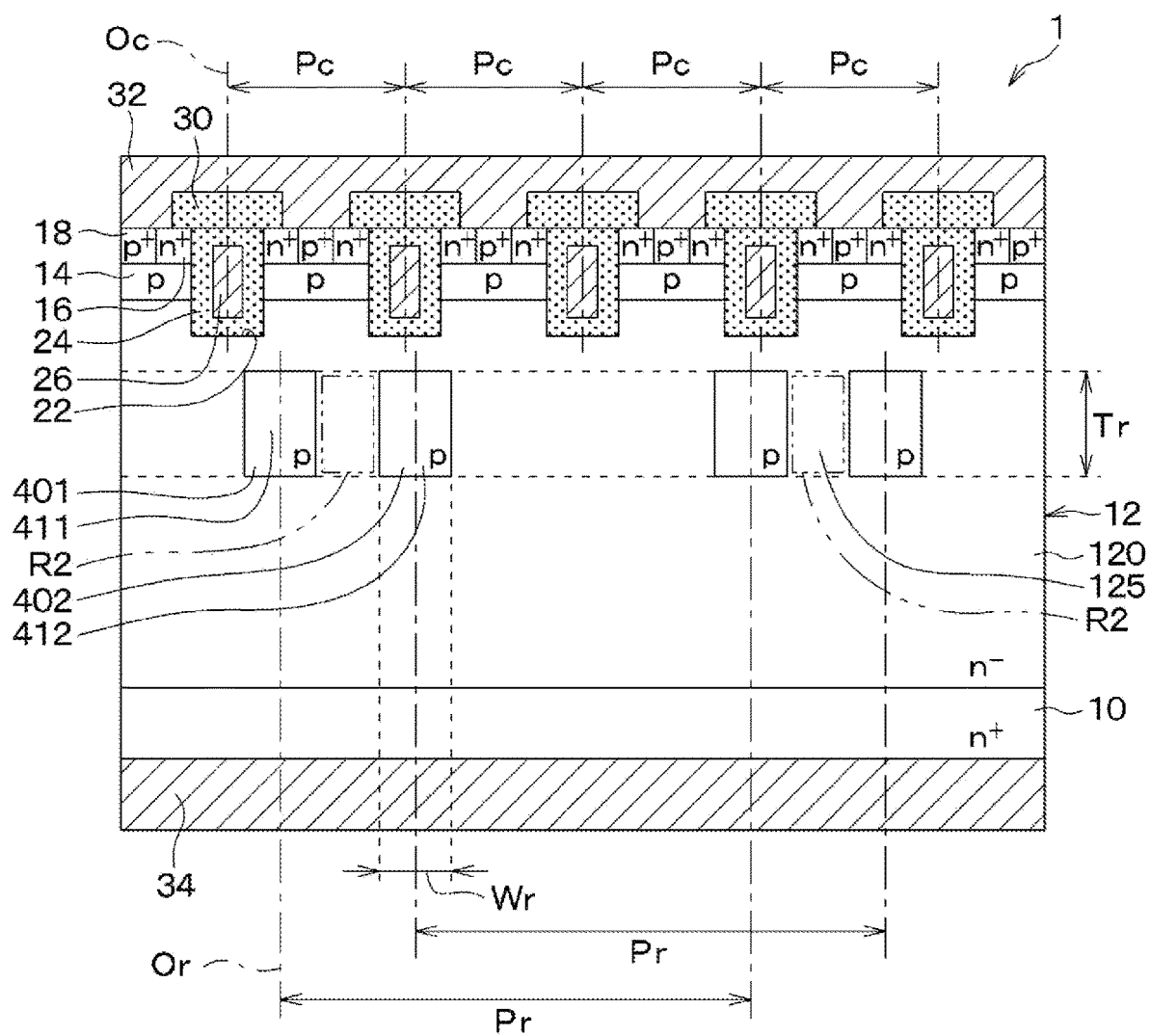
FIG. 20 is a cross-sectional view of the semiconductor device taken along line XX-XX in FIG. 19.

Specifically, the repeat regions 40 have a plurality of first wavy sections 401 and a plurality of second wavy sections 402, as shown in FIG. 19 and FIG. 20. The first wavy sections 401 correspond to the wavy sections 400 described above, and are connected and arranged in a direction orthogonal to the arrangement direction of the gate electrodes 26. The second wavy sections 402 are connected each other and arranged in the direction orthogonal to the arrangement direction of the gate electrodes 26. Furthermore, the first wavy sections 401 are apart from the second wavy sections 402, and the first wavy sections 401 and the second wavy sections 402 are alternately arranged in the arrangement direction of the gate electrodes 26. In the present embodiment, a distance between adjacent two of the first wavy sections 401 in the arrangement direction of the gate electrodes 26 corresponds to the repeat pitch Pr. In addition, a distance between adjacent two of the second wavy sections 402 in the arrangement direction of the gate electrodes 26 corresponds to the repeat pitch Pr.

Center lines each of which passing through a center between each of the first wavy sections 401 and adjacent one of the second wavy sections 402 and extending in the direction orthogonal to the arrangement direction of the gate electrodes 26 are defined as an inter-wavy section center lines Ow.

The second wavy sections 402 are configured so as to be symmetrical to the first wavy sections 401 with respect to the inter-wavy section center line Ow. The second wavy sections 402 are located between adjacent two of the inter-wavy section center lines Ow.

Each of the first wavy sections 401 includes a first straight portion 411, a first inclined portion 421, a first intermediate portion 431, and a second inclined portion 422. The first straight section 411 corresponds to the straight portion 410 described above. The first intermediate portion 431 corresponds to the intermediate portion 430 described above. Therefore, detailed description of the first straight portion 411 and the first intermediate portion 431 will be omitted.

Each of the second wavy sections 402 includes a second straight portion 412, a third inclined portion 423, a second intermediate portion 432, and a fourth inclined portion 424. The second straight portion 412 extends in the direction in which the first straight portion 411 extends. The third inclined portion 423 is connected with the second straight portion 412. The third inclined portion 423 extends from a boundary with the second straight portion 412 while being inclined in a direction symmetrical to the first inclined portion 421 with respect to the inter-wavy section center line Ow. The second intermediate portion 432 is connected with the third inclined portion 423. The second intermediate portion 432 extends from a boundary with the third inclined portion 423 in a direction symmetrical to the first intermediate portion 431 with respect to the inter-wavy section center line Ow. The fourth inclined portion 424 is connected with the second intermediate portion 432. The fourth inclined portion 424 extends from a boundary with the second intermediate portion 432 in a direction symmetrical to the second inclined portion 422 with respect to the inter-wavy section center line Ow.

An end 4240 of the fourth inclined portion 424 opposite to the second intermediate portion 432 in one of the second wavy sections 402 is connected with an end 4120 of the second straight portion 412 opposite to the third inclined portion 423 in adjacent one of the second wavy sections 402. Accordingly, the second wavy sections 402 adjacent to each other are connected and arranged in the direction orthogonal to the arrangement direction of the gate electrodes 26.

Between the first wavy sections 401 and the second wavy sections 402, first regions R1 and second regions R2 are formed. A length of the second region R2 in the arrangement direction of the gate electrodes 26 is shorter than a length of the first region R1 in the arrangement direction of the gate electrodes 26.

Specifically, a region between the first inclined portion 421, the first intermediate portion 431 and the second inclined portion 422, and the third inclined portion 423, the second intermediate portion 432 and the fourth inclined portion 424 is defined as the first region R1. In addition, a region between the first straight portion 411 and the second straight portion 412 is defined as the second region R2. A length between the first straight portion 411 and the second straight portion 412 in the arrangement direction of the gate electrodes 26 is shorter than a length between the first inclined portion 421 and the third inclined portion 423 in the arrangement direction of the gate electrodes 26. The length between the first straight portion 411 and the second straight portion 412 in the arrangement direction of the gate electrodes 26 is shorter than a length between the first intermediate portion 431 and the second intermediate portion 432 in the arrangement direction of the gate electrodes 26. Furthermore, the length between the first straight portion 411 and the second straight portion 412 in the arrangement direction of the gate electrodes 26 is shorter than a length between the second inclined portion 422 and the fourth inclined portion 424 in the arrangement direction of the gate electrodes 26.

The semiconductor device 1 of the sixth embodiment is configured as described above. The sixth embodiment achieves effects similar to the effects achieved by the fifth embodiment. The sixth embodiment also achieves the following effects.

The repeat regions 40 have the first wavy sections 401 and the second wavy sections 402. The second wavy section 402 are configured to as to be symmetrical to the first wavy sections 401 with respect to the inter-wavy section center line Ow. The second wavy sections 402 are located between adjacent two of the inter-wavy section center lines Ow. The first regions R1 and the second regions R2 are formed between the first wavy sections 401 and the second wavy sections 402. The length of the second region R2 in the arrangement direction of the gate electrodes 26 is shorter than the length of the first region R1 in the arrangement direction of the gate electrodes 26.

Figure 21:
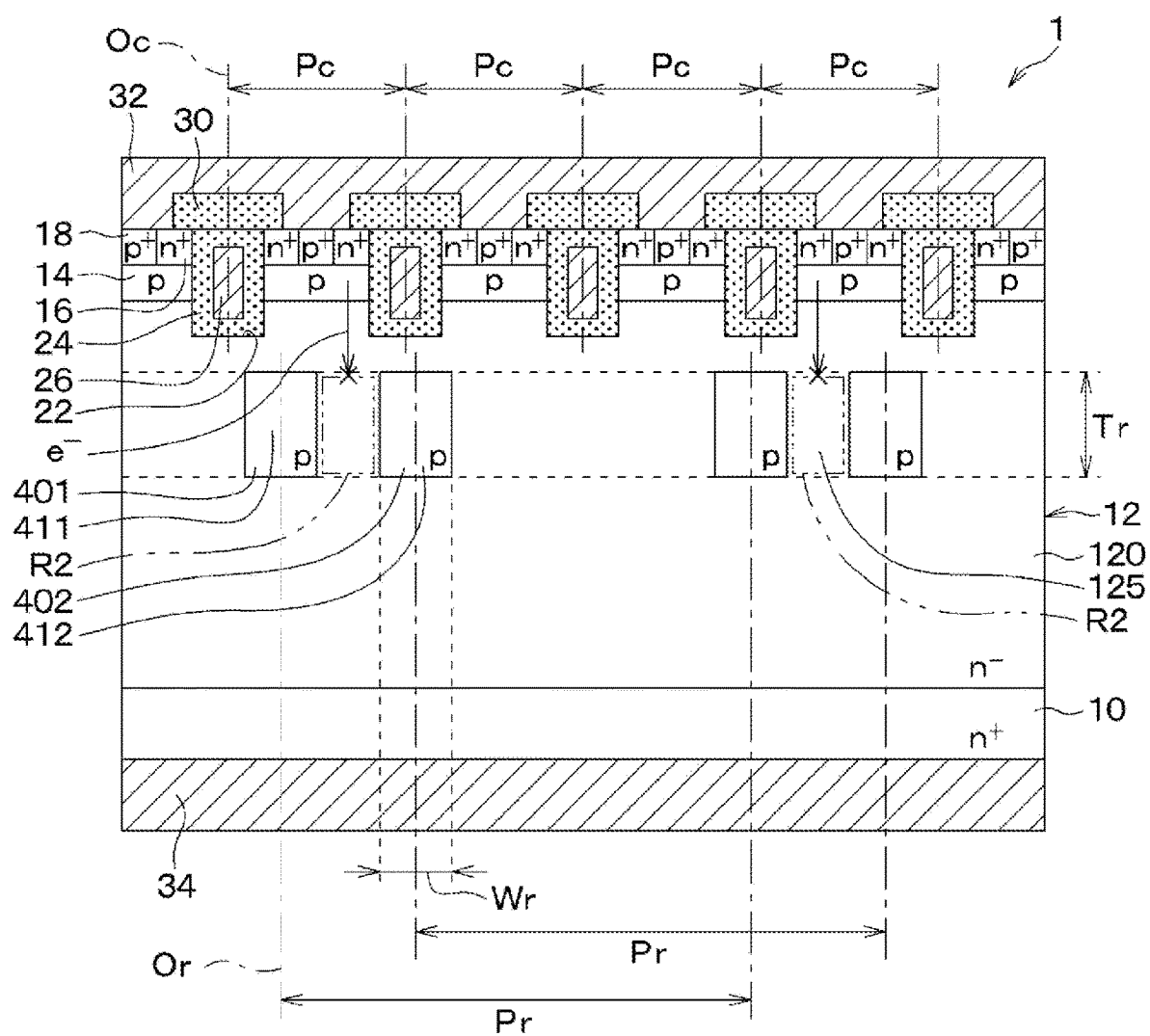
FIG. 21 is a diagram schematically showing electrons that flow in the semiconductor device.
Figure 22:
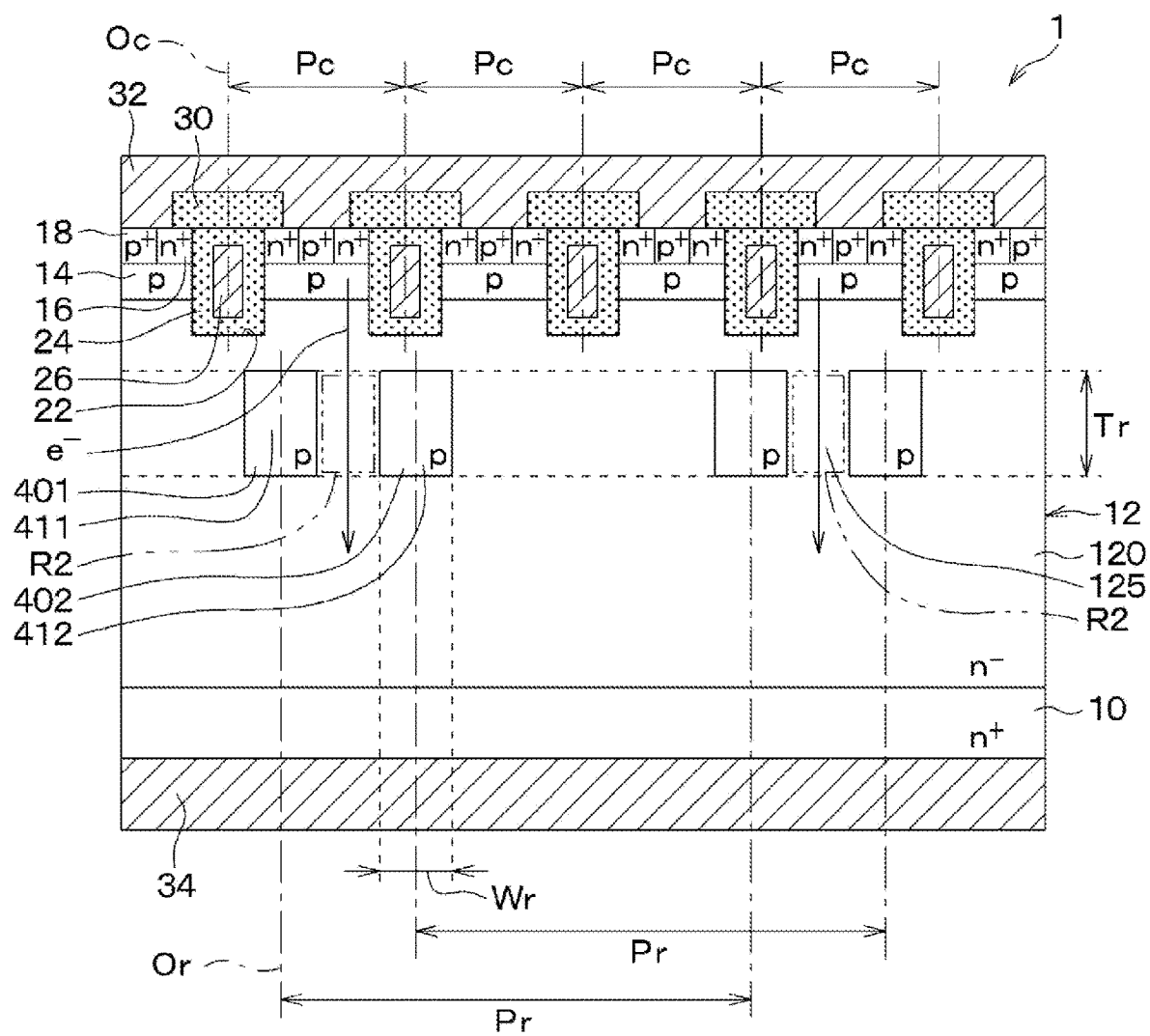
FIG. 22 is a diagram schematically showing electrons that flow in the semiconductor device.

Since the dimension of the second regions R2 is relatively small, when the voltage applied to the drain electrode 34 is relatively high, the flow of electrons to the second regions R2 are interrupted by the development of depletion layers, as shown in FIG. 21. Therefore, electric currents to the second regions R2 are cut off. Accordingly, an increase in a saturation current flowing between the source electrode 32 and the drain electrode 34 can be restricted. Further, when the voltage applied to the drain electrode 34 is relatively low, electrons flow through the second regions R2 as shown in FIG. 22, so that electric currents flow through the second regions R2. Thus, the increase in the on-resistance of the semiconductor device 1 can be restricted. Therefore, the increase in the on-resistance of the semiconductor device 1 can be restricted while improving a short-circuit capacity of the semiconductor device 1. In FIG. 21 and FIG. 22, the flow of electrons is schematically indicated by e$^-$ and arrows.

Modifications of Sixth Embodiment

Figure 23:
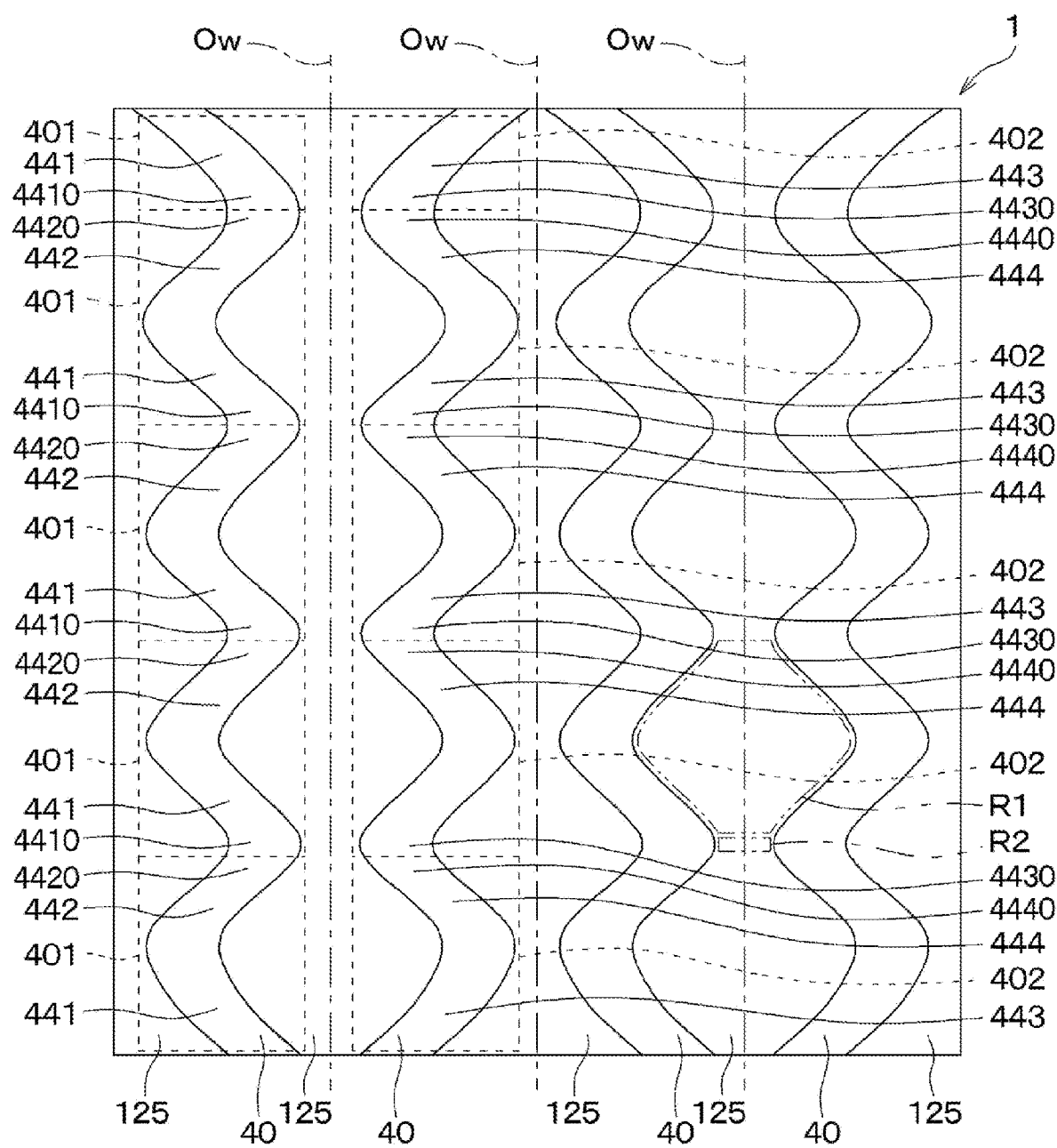
FIG. 23 is an upper surface layout diagram of a part of a semiconductor device according to a modification of the sixth embodiment.

In a modification of the sixth embodiment, as shown in FIG. 23, each of the first wavy sections 401 may include the first curved portion 441 and the second curved portion 442 described above, instead of the first straight portion 411, the first inclined portion 421, the first intermediate portion, and the second inclined portion 422. In addition, each of the second wavy sections 402 may include a third curved portion 443 and a fourth curved portion 444 instead of the second straight portion 412, the third inclined portion 423, the second intermediate portion 432 and the fourth inclined portion 424.

The third curved portion 443 curves and extends so as to be symmetrical to the first curved portion 441 with respect to the inter-wavy section center line Ow. The fourth curved portion 444 curves and extends so as to be symmetrical to the second curved portion 442 with respect to the inter-wavy section center line Ow. An end 4440 of the fourth curved portion 444 opposite to the third curved portion 443 in one of the second wavy sections 402 is connected with an end 4430 of the third curved portion 443 opposite to the fourth curved portion 444 in adjacent one of the second wavy sections 402. Accordingly, the second wavy sections 402 adjacent to each other are connected and arranged in the direction orthogonal to the arrangement direction of the gate electrodes 26. In the above-described configuration, effects similar to the effects achieved by the sixth embodiment can be achieved.

Figure 24:
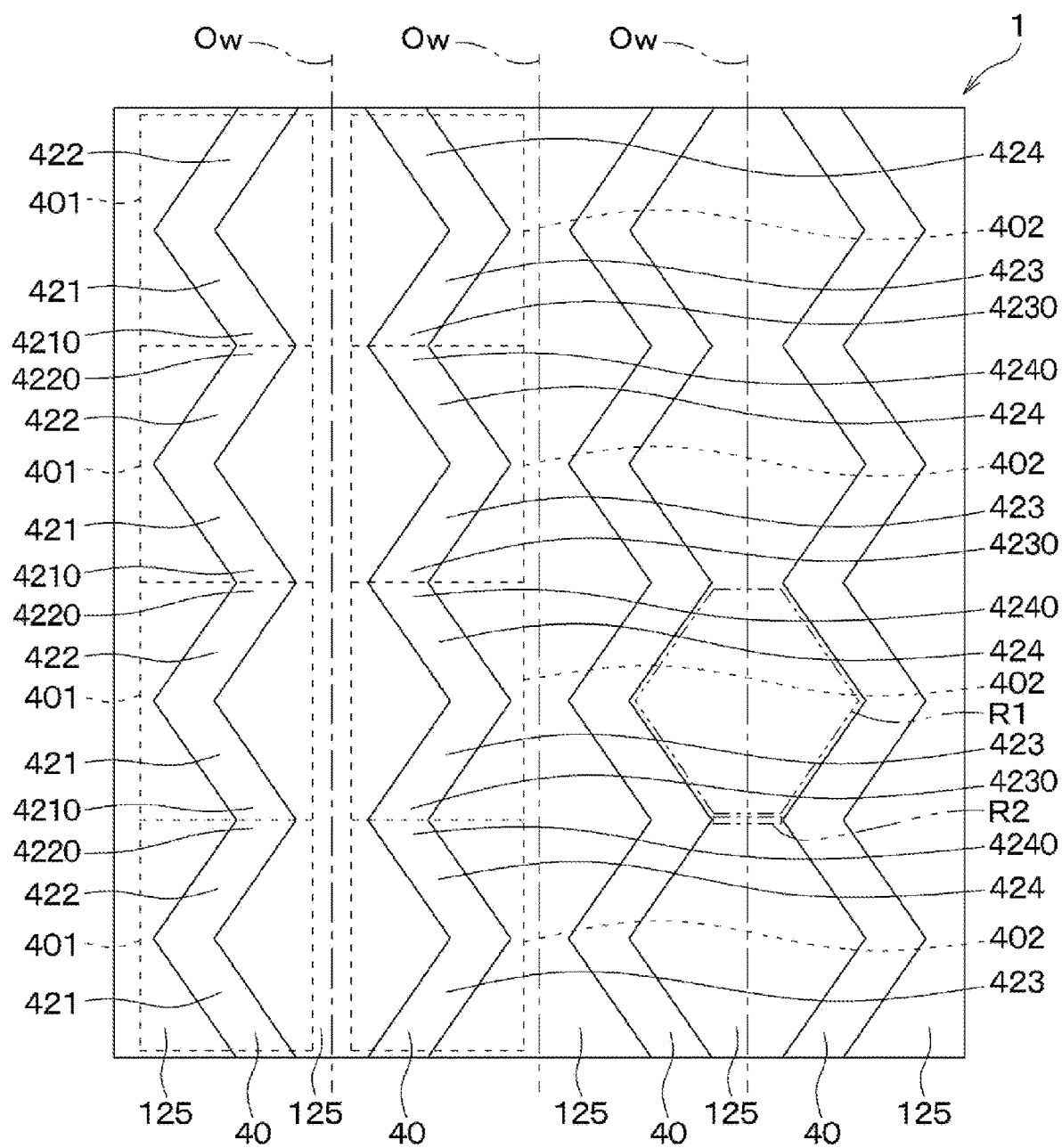
FIG. 24 is an upper surface layout diagram of a part of a semiconductor device according to another modification of the sixth embodiment.

In another modification of the sixth embodiment, as shown in FIG. 24, each of the first wavy sections 401 may include only the first inclined portion 421 and the second inclined portion 422 without the first straight portion 411 and the first intermediate portion 431. In addition, each of the second wavy sections 402 may include only the third inclined portion 423 and the fourth inclined portion 424 without the second straight portion 412 and the second intermediate portion 432. In this case, the end 4240 of the fourth inclined portion 424 opposite to the third inclined portion 423 in one of the second wavy sections 402 is connected with the end 4230 of the third inclined portion 423 opposite to the fourth inclined portion 424 in adjacent one of the second wavy sections 402. Accordingly, the second wavy sections 402 adjacent to each other are connected and arranged in the direction orthogonal to the arrangement direction of the gate electrodes 26. Also in the above-described configuration, effects similar to the effects achieved by the sixth embodiment can be achieved.

Other Embodiments

The present disclosure is not limited to the above-described embodiments, and the above-described embodiments can be appropriately modified. In each of the above-described embodiments, individual elements or features of a particular embodiment are not necessarily essential unless it is specifically stated that the elements or the features are essential, or unless the elements or the features are obviously essential in principle.

In each of the above-described embodiments, SiC is used as the semiconductor material. However, the semiconductor material is not limited to SiC, and may be Si or the like.

In each of the above-described embodiments, the MOSFET has the trench gate structure. However, the MOSFET may have a planar-type gate structure instead of the trench gate structure. In each of the above-described embodiments, the MOSFET is an n-channel MOSFET in which the first conductivity type is n-type and the second conductivity type is p-type. However, the MOSFET is not limited to an n-channel MOSFET, and may be a p-channel MOSFET in which the conductivity type of each component is inverted.

In each of the above-described embodiments, the MOSFET has been described as an example of the semiconductor element. However, the semiconductor element is not limited to the MOSFET and may be other elements such as an insulated gate bipolar transistor (IGBT).

In each of the above-described embodiments, a cross section of each of the repeat regions 40 in the thickness direction of the n$^+$-type substrate 10 along the radial direction centering on the center of the cell region RC has a quadrangular shape. However, the cross section of each of the repeat region 40 may have other shape, such as a rounded quadrangular shape in which four corners are rounded.

In the first embodiment, the repeat regions 40 are the p-type columns forming the super junction structure, and are connected to the source electrode 32 via the coupling layer (not shown). The repeating region 40 may be floated without being connected to the source electrode 32. In the third and fourth embodiments, the first repeat regions 41 are the p-type columns forming the first super junction structure, and are connected to the source electrode 32 via the coupling layer (not shown) and the second repeat regions 42. The first repeated region 41 may be floated without being connected to the source electrode 32 without being connected to the source electrode 32 through the coupling layer (not shown) and the second repeat regions 42.

In each of the above-described embodiments, the n$^+$-type source regions 16 and the p-type contact regions 18 extend in the longitudinal direction of the gate trenches 22. The extending directions of the p-type base regions 14, the n$^+$-type source regions 16 and the p-type contact regions 18 are not limited to the longitudinal direction of the gate trenches 22. The p-type base regions 14, the n$^+$-type source regions 16 and the p-type contact regions 18 may extend, for example, in a direction orthogonal to the longitudinal direction of the gate trenches 22.

In the fourth embodiment, the first repeat regions 41 are the first p-type columns that are alternately repeated with the first n-type columns to form the first super junction structure, and the second repeat regions 42 are the deep layers. The first repeat regions 41 are not limited to the first p-type columns, and may be, for example, deep layers.

The above-described embodiments may be combined with each other as appropriate.

Various Aspects of Present Disclosure

According to a first aspect of the present disclosure, a semiconductor device includes a substrate, a drift layer, a first electrode, a second electrode, a plurality of gate electrodes, and a plurality of repeat regions. The substrate has a front surface and a rear surface opposite to each other, and has a cell region in which a semiconductor element is disposed. The drift layer has a first conductivity type, is disposed on the front surface of the substrate, and has an impurity concentration lower than an impurity concentration of the substrate. The first electrode is disposed close to a surface of the drift layer. The second electrode is disposed close to the rear surface of the substrate. The plurality of gate electrodes is arranged apart from each other in one direction as an arrangement direction of the plurality of gate electrodes. The plurality of gate electrodes is configured to turn on the semiconductor element and cause an electric current to flow between the first electrode and the second electrode in response to an applied voltage. The plurality of repeat regions has a second conductivity type, is disposed in the drift layer, and is arranged apart from each other in the arrangement direction of the plurality of gate electrodes. A plurality of center lines each of which passing through a center of each of the plurality of gate electrodes in the arrangement direction of the plurality of gate electrodes and extending in a thickness direction of the substrate is defined as a plurality of cell center lines. A distance between adjacent two of the plurality of cell center lines in the arrangement direction of the plurality of gate electrodes is defined as a cell pitch. A plurality of center lines each of which passing through a center of each of the plurality of repeat regions in the arrangement direction of the plurality of gate electrodes and extending in the thickness direction of the substrate is defined as a plurality of repeat center lines. A distance between adjacent two of the plurality of repeat center lines in the arrangement direction of the plurality of gate electrodes is defined as a repeat pitch. The cell pitch is different from the repeat pitch.

According to a second aspect of the present disclosure, in the semiconductor device according to the first aspect, the drift layer includes a plurality of columns of the first conductivity type, the plurality of repeat regions is a plurality of columns of the second conductivity type, and the plurality of columns of the first conductivity type and the plurality of columns of the second conductivity type are alternately repeated in the arrangement direction of the plurality of gate electrodes to from a super junction structure.

According to a third aspect of the present disclosure, in the semiconductor device according to the second aspect, a length of each of the plurality of repeat regions in the thickness direction of the substrate is longer than a length of each of the plurality of repeat regions in the arrangement direction of the plurality of gate electrodes.

According to a fourth aspect of the present disclosure, in the semiconductor device according to the first aspect, the plurality of repeat regions is a plurality of deep layers that sandwiches the drift layer in the arrangement direction of the plurality of gate electrodes.

According to a fifth aspect of the present disclosure, in the semiconductor device according to the fourth aspect, a length of each of the plurality of repeat regions in the arrangement direction of the plurality of gate electrodes is longer a length of each of the plurality of repeat regions in the thickness direction of the substrate.

According to a sixth aspect of the present disclosure, in the semiconductor device according to any one of the first to fifth aspects, the plurality of gate electrodes and the plurality of repeat regions are configured to satisfy a relationship of $i \times Pc = j \times Pr$, where Pc is the cell pitch, Pr is the repeat pitch, i is a natural number of two or more, and j is a natural number different from i.

According to a seventh aspect of the present disclosure, in the semiconductor device according to any one of the first to sixth aspects, each of the plurality of repeat regions includes a plurality of wavy sections connected with each other and arranged in an intersection direction that is a direction intersecting the arrangement direction of the plurality of gate electrodes. Each of the plurality of wavy sections includes a straight portion extending in the intersection direction, a first inclined portion connected with the straight portion and extending from a boundary portion with the straight portion while being inclined with respect to the intersection direction, an intermediate portion connected with the first inclined portion and extending from a boundary with the first inclined portion in the intersection direction, and a second inclined portion connected with the intermediate portion and extending from a boundary with the intermediate portion while being inclined with respect to the intersection direction. An end of the second inclined portion opposite to the intermediate portion in one of the plurality of wavy sections is connected with an end of the straight portion opposite to the first inclined portion in adjacent one of the plurality of wavy sections so that the one of the plurality of wavy sections and the adjacent one of the plurality of wavy sections are connected and arranged in the intersection direction.

According to an eighth aspect of the present disclosure, in the semiconductor device according to any one of the first to sixth aspects, each of the plurality of repeat regions includes a plurality of wavy sections connected with each other and arranged in an intersection direction that is a direction intersecting the arrangement direction of the plurality of gate electrodes. Each of the plurality of wavy sections includes a first curved portion extending in a curved manner so that a tangent to the first curved portion is inclined with respect to the intersection direction, and a second curved portion connected with the first curved portion and extending in a curved manner from a boundary with the first curved portion so that a tangent to the second curved portion is inclined with respect to the intersection direction. An end of the second curved portion opposite to the first curved portion in one of the plurality of wavy sections is connected with an end of the first curved portion opposite to the second curved portion in adjacent one of the plurality of wavy sections so that the one of the plurality of wavy sections and the adjacent one of the plurality of wavy sections are connected and arranged in the intersection direction.

According to a ninth aspect of the present disclosure, in the semiconductor device according to any one of the first to sixth aspects, each of the plurality of repeat regions includes a plurality of wavy sections connected with each other and arranged in an intersection direction that is a direction intersecting the arrangement direction of the plurality of gate electrodes. Each of the plurality of wavy sections includes a first inclined portion extending in a direction inclined with respect to the intersection direction, and a second inclined portion connected with the first inclined portion and extending from a boundary with the first inclined portion in a direction inclined with respect the intersection direction. An end of the second inclined portion opposite to the first inclined portion in one of the plurality of wavy sections is connected with an end of the first inclined portion opposite to the second inclined portion in adjacent one of the plurality of wavy sections so that the one of the plurality of wavy sections and the adjacent one of the plurality of wavy sections are connected and arranged in the intersection direction.

According to a tenth aspect of the present disclosure, in the semiconductor device according to any one of the seventh to ninth aspects, the drift layer and the plurality of repeat regions are configured to satisfy a relationship of α×Nr×Wr=Nd×Wd, where a is a coefficient within a range from 0.5 to 1.5, Nr is a second conductivity-type impurity concentration of the plurality of repeat regions, Wr is a length of each of the plurality of repeat regions in the arrangement direction of the plurality of gate electrodes, Nd is a first conductivity-type impurity concentration of the drift layer, Wd is a sum of a first distance and a second distance. A center line passing through a center between adjacent two of the plurality of repeat regions in the arrangement direction of the plurality of gate electrodes and extending in a direction along the plurality of wavy sections is defined as a first center line, a center line adjacent to the first center line in the arrangement direction of the plurality of gate electrodes is defined as a second center line, the first distance is a distance from the first center line to one of the plurality of repeat regions that is located between the first center line and the second center line in the arrangement direction of the plurality of gate electrodes, and the second distance is a distance from the second center line to the one of the plurality of repeat regions that is located between the first center line and the second center line in the arrangement direction of the plurality of gate electrodes.

According to an eleventh aspect of the present disclosure, in the semiconductor device according to any one of the first to sixth aspects, the plurality of repeat regions includes a plurality of first wavy sections connected with each other and arranged in an intersection direction that is a direction intersecting the arrangement direction of the plurality of gate electrodes, and a plurality of second wavy sections connected with each other and arranged in the intersection direction. The plurality of first wavy sections is apart from the plurality of second wavy sections, and the plurality of first wavy sections and the plurality of second wavy sections are alternately arranged in the arrangement direction of the plurality of gate electrodes. A plurality of center lines each of which passing through a center between each of the plurality of first wavy sections and adjacent one of the plurality of second wavy sections and extending in the intersection direction is defined as a plurality of inter-wavy section center lines. The each of the plurality of first wavy sections and the adjacent one of the plurality of second wavy sections are symmetrical to each other with respect to one of the inter-wavy section center lines located between the each of the plurality of first wavy sections and the adjacent one of the second wavy sections, and each of the plurality of second wavy sections is located between adjacent two of the inter-wavy section center lines. A first region and a second region are formed between the each of the plurality of first wavy sections and the adjacent one of the plurality of second wavy sections, and a length of the second region in the arrangement direction of the plurality of gate electrodes is shorter than a length of the first region in the arrangement direction of the plurality of gate electrodes.

When indicating the crystal orientation, a bar (−) is originally attached above a desired number. However, since there are restrictions on expression based on electronic filing, a bar is attached in front of the desired number in the present specification.

What is claimed is:

1. A semiconductor device comprising:
   a substrate having a front surface and a rear surface opposite to each other, and having a cell region in which a semiconductor element is disposed;
   a drift layer of a first conductivity type disposed on the front surface of the substrate, and having an impurity concentration lower than an impurity concentration of the substrate;
   a first electrode disposed close to a surface of the drift layer;
   a second electrode disposed close to the rear surface of the substrate;
   a plurality of gate electrodes arranged apart from each other in one direction as an arrangement direction of the plurality of gate electrodes, the plurality of gate electrodes configured to turn on the semiconductor element and cause an electric current to flow between the first electrode and the second electrode in response to an applied voltage; and
   a plurality of repeat regions of a second conductivity type disposed in the drift layer and arranged apart from each other in the arrangement direction of the plurality of gate electrodes, wherein
   a plurality of center lines each of which passing through a center of each of the plurality of gate electrodes in the arrangement direction of the plurality of gate electrodes and extending in a thickness direction of the substrate is defined as a plurality of cell center lines,
   a distance between adjacent two of the plurality of cell center lines in the arrangement direction of the plurality of gate electrodes is defined as a cell pitch,
   a plurality of center lines each of which passing through a center of each of the plurality of repeat regions in the arrangement direction of the plurality of gate electrodes and extending in the thickness direction of the substrate is defined as a plurality of repeat center lines,
   a distance between adjacent two of the plurality of repeat center lines in the arrangement direction of the plurality of gate electrodes is defined as a repeat pitch, and
   the cell pitch is different from the repeat pitch.

2. The semiconductor device according to claim 1, wherein
   the drift layer includes a plurality of columns of the first conductivity type,
   the plurality of repeat regions is a plurality of columns of the second conductivity type, and the plurality of columns of the first conductivity type and the plurality of columns of the second conductivity type are alternately repeated in the arrangement direction of the plurality of gate electrodes to from a super junction structure.

3. The semiconductor device according to claim 2, wherein
   a length of each of the plurality of repeat regions in the thickness direction of the substrate is longer than a length of each of the plurality of repeat regions in the arrangement direction of the plurality of gate electrodes.

4. The semiconductor device according to claim 1, wherein
   the plurality of repeat regions is a plurality of deep layers that sandwiches the drift layer in the arrangement direction of the plurality of gate electrodes.

5. The semiconductor device according to claim 4, wherein
a length of each of the plurality of repeat regions in the arrangement direction of the plurality of gate electrodes is longer a length of each of the plurality of repeat regions in the thickness direction of the substrate.

6. The semiconductor device according to claim 1, wherein
the plurality of gate electrodes and the plurality of repeat regions are configured to satisfy a relationship of i×Pc=j×Pr, where
Pc is the cell pitch,
Pr is the repeat pitch,
i is a natural number of two or more, and
j is a natural number of two or more different from i.

7. The semiconductor device according to claim 1, wherein
each of the plurality of repeat regions includes a plurality of wavy sections connected with each other and arranged in an intersection direction that is a direction intersecting the arrangement direction of the plurality of gate electrodes,
each of the plurality of wavy sections includes:
a straight portion extending in the intersection direction;
a first inclined portion connected with the straight portion and extending from a boundary portion with the straight portion while being inclined with respect to the intersection direction;
an intermediate portion connected with the first inclined portion and extending from a boundary with the first inclined portion in the intersection direction; and
a second inclined portion connected with the intermediate portion and extending from a boundary with the intermediate portion while being inclined with respect to the intersection direction, and
an end of the second inclined portion opposite to the intermediate portion in one of the plurality of wavy sections is connected with an end of the straight portion opposite to the first inclined portion in adjacent one of the plurality of wavy sections so that the one of the plurality of wavy sections and the adjacent one of the plurality of wavy sections are connected and arranged in the intersection direction.

8. The semiconductor device according to claim 1, wherein
each of the plurality of repeat regions includes a plurality of wavy sections connected with each other and arranged in an intersection direction that is a direction intersecting the arrangement direction of the plurality of gate electrodes,
each of the plurality of wavy sections includes:
a first curved portion extending in a curved manner so that a tangent to the first curved portion is inclined with respect to the intersection direction; and
a second curved portion connected with the first curved portion and extending in a curved manner from a boundary with the first curved portion so that a tangent to the second curved portion is inclined with respect to the intersection direction, and
an end of the second curved portion opposite to the first curved portion in one of the plurality of wavy sections is connected with an end of the first curved portion opposite to the second curved portion in adjacent one of the plurality of wavy sections so that the one of the plurality of wavy sections and the adjacent one of the plurality of wavy sections are connected and arranged in the intersection direction.

9. The semiconductor device according to claim 1, wherein
each of the plurality of repeat regions includes a plurality of wavy sections connected with each other and arranged in an intersection direction that is a direction intersecting the arrangement direction of the plurality of gate electrodes,
each of the plurality of wavy sections includes:
a first inclined portion extending in a direction inclined with respect to the intersection direction; and
a second inclined portion connected with the first inclined portion and extending from a boundary with the first inclined portion in a direction inclined with respect the intersection direction, and
an end of the second inclined portion opposite to the first inclined portion in one of the plurality of wavy sections is connected with an end of the first inclined portion opposite to the second inclined portion in adjacent one of the plurality of wavy sections so that the one of the plurality of wavy sections and the adjacent one of the plurality of wavy sections are connected and arranged in the intersection direction.

10. The semiconductor device according to claim 7, wherein
the drift layer and the plurality of repeat regions are configured to satisfy a relationship of $\alpha \times Nr \times Wr = Nd \times Wd$, where
$\alpha$ is a coefficient within a range from 0.5 to 1.5,
Nr is a second conductivity-type impurity concentration of the plurality of repeat regions,
Wr is a length of each of the plurality of repeat regions in the arrangement direction of the plurality of gate electrodes,
Nd is a first conductivity-type impurity concentration of the drift layer,
Wd is a sum of a first distance and a second distance,
a center line passing through a center between adjacent two of the plurality of repeat regions in the arrangement direction of the plurality of gate electrodes and extending in a direction along the plurality of wavy sections is defined as a first center line,
a center line adjacent to the first center line in the arrangement direction of the plurality of gate electrodes is defined as a second center line,
the first distance is a distance from the first center line to one of the plurality of repeat regions that is located between the first center line and the second center line in the arrangement direction of the plurality of gate electrodes, and
the second distance is a distance from the second center line to the one of the plurality of repeat regions that is located between the first center line and the second center line in the arrangement direction of the plurality of gate electrodes.

11. The semiconductor device according to claim 1, wherein
the plurality of repeat regions includes:
a plurality of first wavy sections connected with each other and arranged in an intersection direction that is a direction intersecting the arrangement direction of the plurality of gate electrodes; and
a plurality of second wavy sections connected with each other and arranged in the intersection direction,
the plurality of first wavy sections is apart from the plurality of second wavy sections, and the plurality of first wavy sections and the plurality of second wavy sections are alternately arranged in the arrangement direction of the plurality of gate electrodes, a plurality of center lines each of which passing through a center between each of the plurality of first wavy sections and adjacent one of the plurality of second wavy sections and extending in the intersection direction is defined as a plurality of inter-wavy section center lines, the each of the plurality of first wavy sections and the adjacent one of the plurality of second wavy sections are symmetrical to each other with respect to one of the inter-wavy section center lines located between the each of the plurality of first wavy sections and the adjacent one of the second wavy sections, and each of the plurality of second wavy sections is located between adjacent two of the inter-wavy section center lines, and a first region and a second region are formed between the each of the plurality of first wavy sections and the adjacent one of the plurality of second wavy sections, and a length of the second region in the arrangement direction of the plurality of gate electrodes is shorter than a length of the first region in the arrangement direction of the plurality of gate electrodes.

* * * * *